(12) United States Patent
Tomishima

(10) Patent No.: US 9,715,916 B1
(45) Date of Patent: Jul. 25, 2017

(54) SUPPLY-SWITCHED DUAL CELL MEMORY BITCELL

(71) Applicant: INTEL CORPORATION, Santa Clara, CA (US)

(72) Inventor: Shigeki Tomishima, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/080,563

(22) Filed: Mar. 24, 2016

(51) Int. Cl.
*G11C 11/00* (2006.01)
*G11C 11/16* (2006.01)

(52) U.S. Cl.
CPC ...... *G11C 11/1673* (2013.01); *G11C 11/1675* (2013.01)

(58) Field of Classification Search
USPC ......................................... 365/148, 158, 156
See application file for complete search history.

(56) References Cited

U.S. PATENT DOCUMENTS

| 8,023,299 | B1 | 9/2011 | Gharia |
| 8,797,792 | B2 | 8/2014 | Rao et al. |
| 8,964,458 | B2 | 2/2015 | Lin et al. |
| 2009/0251949 | A1 | 10/2009 | Xia |
| 2013/0208527 | A1* | 8/2013 | Peters ................. G11C 11/1673 365/148 |
| 2013/0258750 | A1 | 10/2013 | Kim et al. |
| 2013/0272059 | A1* | 10/2013 | Lin .................... G11C 11/161 365/158 |
| 2014/0071740 | A1* | 3/2014 | Kim .................... G11C 11/1675 365/158 |

OTHER PUBLICATIONS

Noguchi, H., et al., "A 250-MHz 256b-I/O 1-Mb STT-MRAM with Advanced Perpendicular MTJ based Dual Cell for Nonvolatile Magnetic Caches to Reduce Active Power of Processors", Proceedings of the 2013 Symposium on VLSI Circuits Digest of Technical Papers, 2013, 2 pp.

Kawasumi, A., et al., "Circuit Techniques in Realizing Voltage-Generator-Less STT MRAM Suitable for Normally-Off-Type Non-Volatile L2 Cache Memory", Procedings of the 2013 5th IEEE International Memory Workshop (IMW), May 2013, 4 pp.

(Continued)

*Primary Examiner* — Vu Le
(74) *Attorney, Agent, or Firm* — Konrad Raynes Davda & Victor LLP

(57) ABSTRACT

In one embodiment, a bit state in a supply-switched dual cell memory bitcell in accordance with the present description, may be read by coupling a supply line to a common node of the bitcell to drive complementary currents through complementary resistance state storage cells for a pair of complementary bit line signal lines of the bitcell. The bit state of the bitcell may be read by sensing complementary bit state signals on the pair of first and second complementary bit line signal lines. In one embodiment, each resistance state storage cell has a resistance state ferromagnetic device such as a magnetic-tunneling junction (MTJ). In one embodiment, a supply-switched dual cell memory bitcell in accordance with the present description may lack a source or select line (SL) signal line. Other aspects are described herein.

25 Claims, 14 Drawing Sheets

(56) References Cited

OTHER PUBLICATIONS

Noguchi, H. et al., "Highly Reliable and Low-Power Nonvolatile Cache Memory with Advanced Perpendicular STT-MRAM for High-Performance CPU", 2014 Symposium on VLSI Circuits Digest of Technical Papers, 2014, 2 pp.

International Search Report and Written Opinion for International Application No. PCT/US2017/018985, dated Jun. 2, 2017, 17 pp. [77.337PCT (ISR & WO)].

* cited by examiner

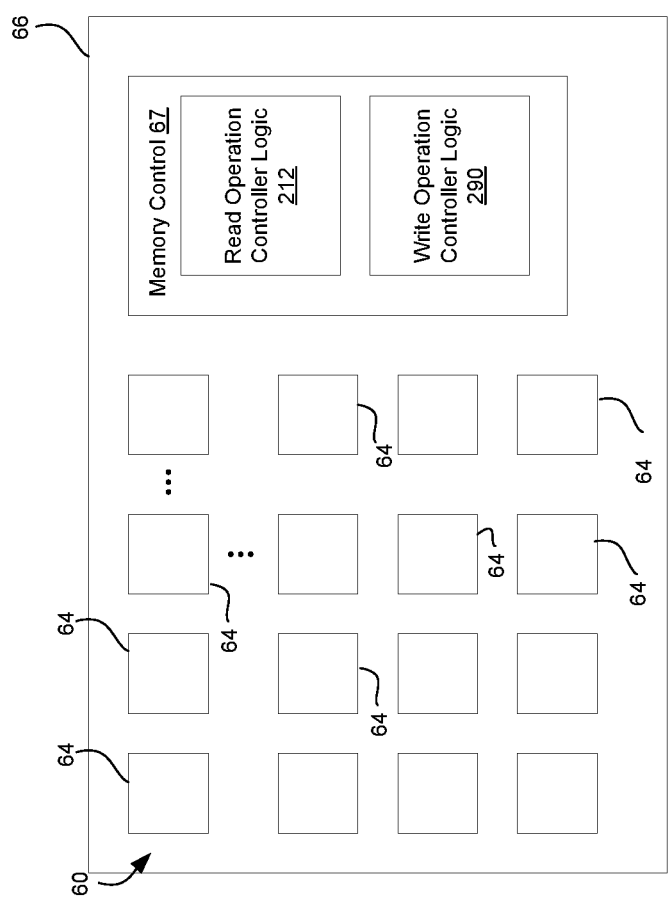

SUPPLY-SWITCHED DUAL CELL MEMORY BITCELL

TECHNICAL FIELD

Certain embodiments of the present description relate generally to non-volatile memory.

BACKGROUND

Spin Transfer Torque Random Access Memory (STTRAM) is a type of magnetoresistive Random Access Memory (MRAM) which is non-volatile and is typically used for memory circuits, such as, cache, memory, secondary storage, and other memory applications. STTRAM memory may often be operated at reduced power levels and may be less expensive as compared to other memory types.

Spin Transfer Torque (STT) is an effect in which the orientation of a magnetic layer in a magnetic tunnel junction (MTJ) device can be modified using a spin-polarized current. In STT-based MTJs, device resistance can be either low or high, depending on the relative angular difference between the directions of magnetic polarization on both sides of the tunnel junction. Accordingly, one bit state of an MTJ may be represented by a state in which the ferromagnetic layers of the MTJ have a parallel magnetic orientation and exhibit low resistance. Conversely, an opposite bit state may be represented by a state in which the ferromagnetic layers of the MTJ have an anti-parallel magnetic orientation and exhibit high resistance.

BRIEF DESCRIPTION OF THE DRAWINGS

Embodiments of the present disclosure are illustrated by way of example, and not by way of limitation, in the figures of the accompanying drawings in which like reference numerals refer to similar elements.

FIG. 2 depicts a basic architecture of an STTRAM memory in accordance with an embodiment of the present disclosure.

DESCRIPTION OF EMBODIMENTS

Figure 1:
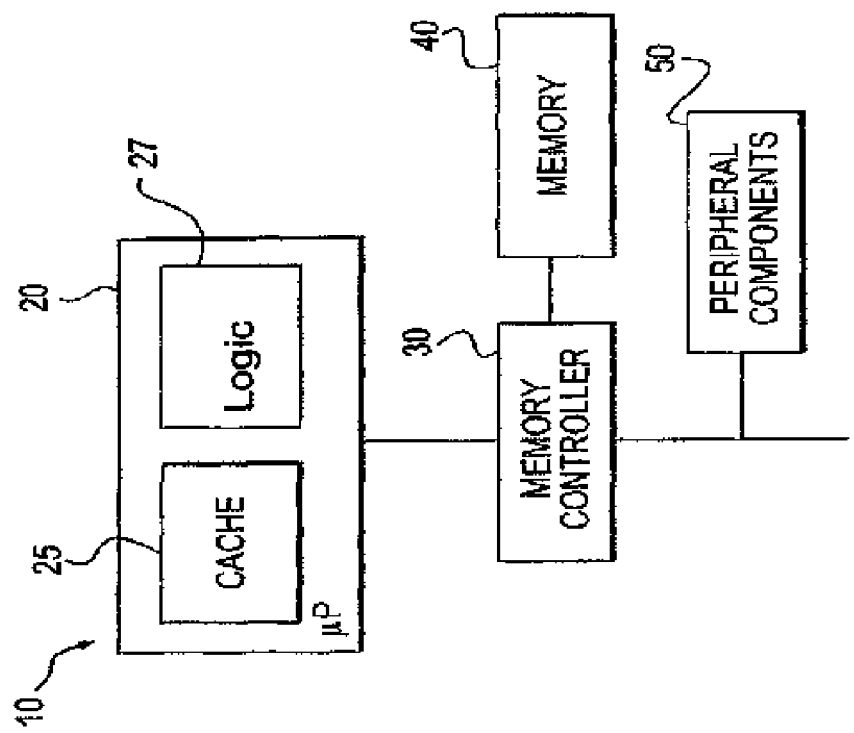
FIG. 1 depicts a high-level block diagram illustrating one embodiment of a system employing a supply-switched dual cell memory bitcell in accordance with the present description.

In the description that follows, like components have been given the same reference numerals, regardless of whether they are shown in different embodiments. To illustrate one or more embodiments of the present disclosure in a clear and concise manner, the drawings may not necessarily be to scale and certain features may be shown in somewhat schematic form. Features that are described or illustrated with respect to one embodiment may be used in the same way or in a similar way in one or more other embodiments or in combination with or instead of features of other embodiments.

In one aspect of the present description, a supply-switched dual cell memory bitcell has a reduced number of signal lines for storing and reading a data bit. For example, in one embodiment, the supply-switched dual cell memory bitcell lacks a source or select line (SL) signal line typical of many previous existing and proposed STTRAM bitcells. As explained in greater detail below, by eliminating the SL signal line, layout restrictions of circuit elements may be relaxed, which may facilitate cell size shrinkage as circuit fabrication processes advance. In addition, a supply line to the bitcell may be meshed in the form of an orthogonal grid of supply lines to provide increased reliability and stability of bitcell operations such as read operations.

In one embodiment, a bit state in a supply-switched dual cell memory bitcell in accordance with the present description, may be read by coupling a supply line such as power supply line or ground supply line, for example, to a common node of the bitcell to drive first and second complementary currents through first and second complementary resistance state storage cells, respectively, of the bitcell, for a pair of first and second complementary bit line signal lines, respectively, of the bitcell. The bit state of the bitcell may be read by sensing complementary bit state signals on the pair of first and second complementary bit line signal lines.

In one embodiment, each resistance state storage cell has a resistance state ferromagnetic device such as a magnetic-tunneling junction (MTJ). Each resistance state ferromagnetic device has a resistance state complementary to a resistance state of the resistance state ferromagnetic device of the complementary resistance state storage cell.

Read operation controller logic of a memory controller is configured to read the bit state of the bitcell by activating first and second storage cell switch transistors of the first and second complementary resistance state storage cells, respectively, to permit the first and second complementary currents to pass through the first and second complementary resistance state storage cells. In addition, a supply switch transistor of the bitcell is activated to couple the supply line to the common node of the bitcell to drive the first and second complementary currents through the first and second complementary resistance state storage cells, respectively. In this manner, the bitcell provides complementary bit state signals on the complementary bit line signal lines wherein the bit state of the bitcell is read. Other aspects and features of a supply-switched dual cell memory bitcell in accordance with the present description, are described below.

Although described in connection with an STTRAM, it is appreciated that a supply-switched dual cell memory bitcell in accordance with the present description may be applied to MRAM devices other than STT MRAM devices such as giant magnetoresistance (GMR) MRAM, toggle MRAM and other MRAM devices. Such MRAM-based memory elements in accordance with embodiments described herein can be used either in stand-alone memory circuits or logic arrays, or can be embedded in microprocessors and/or digital signal processors (DSPs). Additionally, it is noted that although systems and processes are described herein primarily with reference to microprocessor based systems in the illustrative examples, it will be appreciated that in view of the disclosure herein, certain aspects, architectures, and principles of the disclosure are equally applicable to other types of device memory and logic devices.

Turning to the figures, FIG. 1 is a high-level block diagram illustrating selected aspects of a computing system implemented, according to an embodiment of the present disclosure. System 10 may represent any of a number of electronic or other computing devices, that may include a memory device. Such electronic devices may include computing devices such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). System 10 can be powered by a battery, renewable power source (e.g., solar panel), wireless charging, or by use of an AC outlet.

In alternative embodiments, system 10 may include more elements, fewer elements, and/or different elements. Moreover, although system 10 may be depicted as comprising separate elements, it will be appreciated that such elements may be integrated on to one platform, such as systems on a chip (SoCs). In the illustrative example, system 10 comprises a microprocessor 20, a memory controller 30, a memory 40 and peripheral components 50 which may include, for example, video controller, input device, output device, storage, network adapter, a power source (including a battery, renewable power source (e.g., photovoltaic panel), wireless charging, or coupling to an AC outlet), etc. The microprocessor 20 includes a cache 25 that may be part of a memory hierarchy to store instructions and data, and the system memory 40 may also be part of the memory hierarchy. Communication between the microprocessor 20 and the memory 40 may be facilitated by the memory controller (or chipset) 30, which may also facilitate in communicating with the peripheral components 50.

Storage of the peripheral components 50 may be, for example, non-volatile storage, such as solid-state drives, magnetic disk drives, optical disk drives, a tape drive, flash memory, etc. The storage may comprise an internal storage device or an attached or network accessible storage. The microprocessor 20 is configured to write data in and read data from the memory 40. Programs in the storage are loaded into the memory and executed by the processor. A network controller or adapter enables communication with a network, such as an Ethernet, a Fiber Channel Arbitrated Loop, etc. Further, the architecture may, in certain embodiments, include a video controller configured to display information represented by data in a memory on a display monitor, where the video controller may be embodied on a video card or integrated on integrated circuit components mounted on a motherboard or other substrate. An input device is used to provide user input to the processor, and may include a keyboard, mouse, pen-stylus, microphone, touch sensitive display screen, input pins, sockets, or any other activation or input mechanism known in the art. An output device is capable of rendering information transmitted from the processor, or other component, such as a display monitor, printer, storage, output pins, sockets, etc. The network adapter may embodied on a network card, such as a Peripheral Component Interconnect (PCI) card, PCI-express, or some other I/O card, or on integrated circuit components mounted on a motherboard or other substrate.

One or more of the components of the device 10 may be omitted, depending upon the particular application. For example, a network router may lack a video controller, for example.

Any one or more of the memory devices 25, 40, and the other devices 10, 30, 50 may include a supply-switched dual cell memory bitcell in accordance with the present description, or be embodied as any type of data storage capable of storing data in a persistent manner (even if power is interrupted to non-volatile memory) such as but not limited to any combination of memory devices that use chalcogenide phase change material (e.g., chalcogenide glass), three-dimensional (3D) crosspoint memory, or other types of byte-addressable, write-in-place non-volatile memory, ferroelectric transistor random-access memory (FeTRAM), nanowire-based non-volatile memory, phase change memory (PCM), memory that incorporates memristor technology, Magnetoresistive random-access memory (MRAM) or another Spin Transfer Torque (STT)-MRAM.

FIG. 2 shows an example of a rectangular or orthogonal array 60 of rows and columns of MRAM bitcells such as the bitcells 64 of an STT cache memory 66 in accordance with one embodiment of the present description. Each bitcell 64 is configured to store a bit state.

The STT cache memory 66 may also include a row decoder, a timer device and I/O devices (or I/O outputs). Bits of the same memory word may be separated from each other for efficient I/O design. A multiplexer (MUX) may be used to connect each column to the required circuitry during a READ operation. Another MUX may be used to connect each column to a write driver during a WRITE operation. A control circuit 67 such as a memory controller is configured to control and perform read and write operations directed to the bitcells 64 as explained below. The control circuit 67 is configured to perform the described operations using appropriate hardware, software or firmware, or various combinations thereof.

Figure 3A:
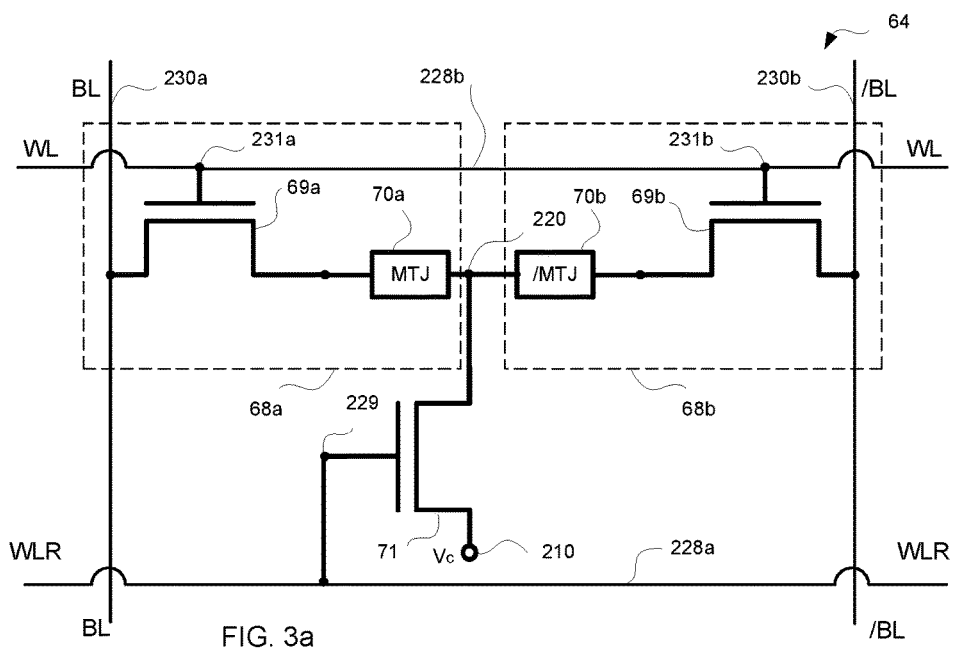
FIGS. 3a-3d depict an embodiment of a supply-switched dual cell memory bitcell in accordance with the present description.
Figure 3B:
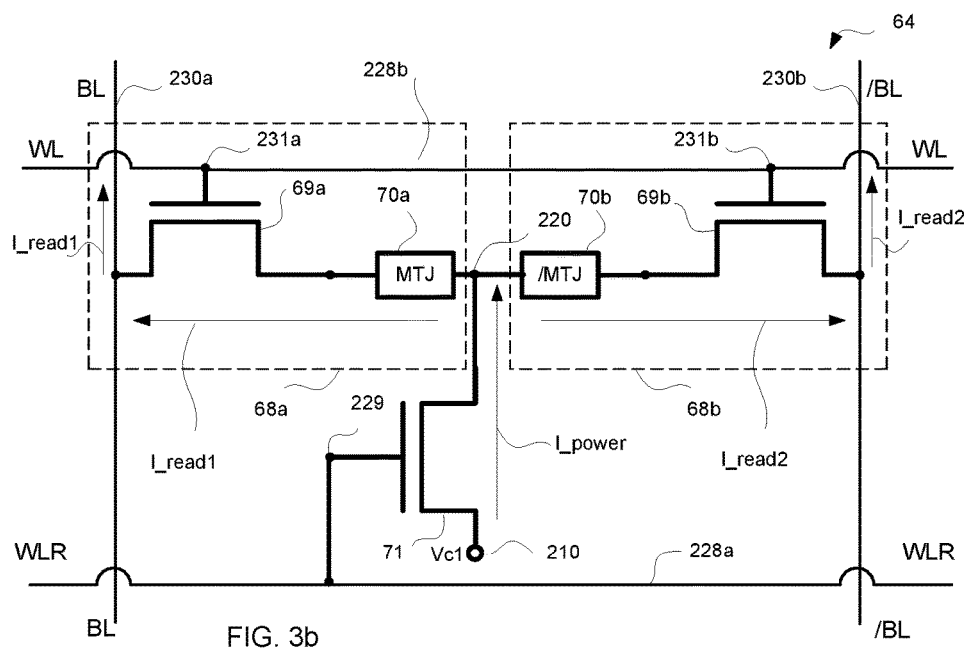
Figure 3C:
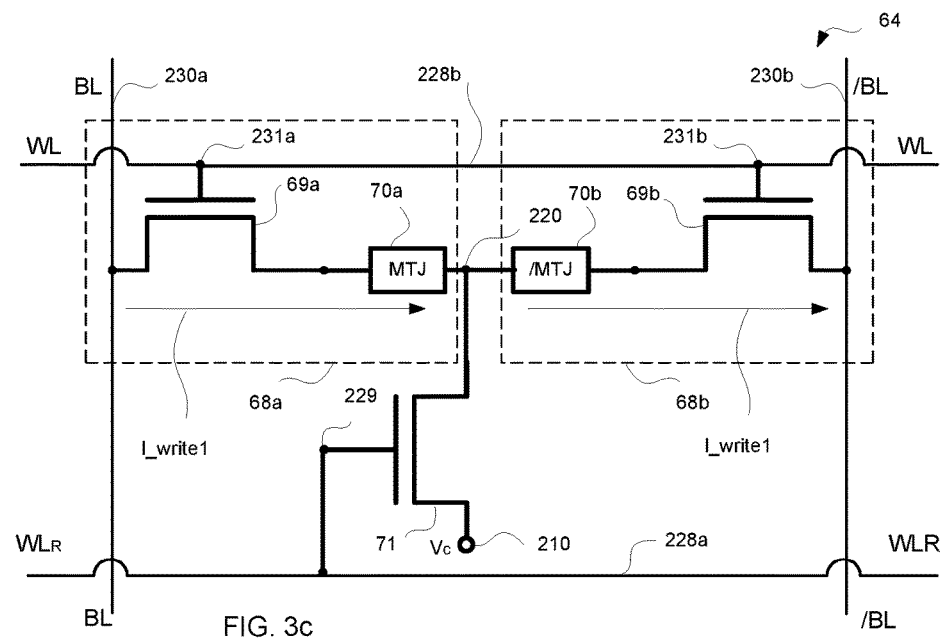

In one embodiment, each bitcell 64 of the array 60 of bitcells 64 includes a complementary pair of resistance state storage cells 68a, 68b (FIG. 3a-3d), each of which includes a storage cell switch transistor 69a, 69b and a resistance state ferromagnetic device 70a, 70b such as a spin valve, or a magnetic tunnel junction (MTJ) device as shown in FIG. 3a. In addition, a supply switch transistor 71 is configured to selectively couple when activated, a Vc power supply line such as a constant voltage or constant current line 210 to the dual cells 68a, 68b for read operations as explained in greater detail below. Although depicted as a voltage or current power supply line, it is appreciated that the supply line 210 may be a ground (GND) supply line, depending upon the particular application.

In the illustrated embodiment, the switch transistors 69a, 69b, 71 may be n-channel metal-oxide semiconductor (NMOS) transistors. Thus, in this example, the supply switch transistor 71 is controlled by a true drive signal such word line read (WLR) signal, for example. However, it is appreciated that the switch transistors such as the supply switch transistor 71 may be p-channel (PMOS) transistor and controlled by a complementary drive signal such as /WLR, for example, in other embodiments. Although depicted as metal-oxide semiconductor (MOS) transistors, it is appreciated that the switch transistors such as the switch transistors 69a, 69b, 71 may be other types of switches and other types of transistors such as bipolar (including npn and pnp) for example.

In one aspect of the present description, the supply-switched dual cell memory bitcell 64 of FIGS. 3a-3d has a reduced number of signal lines for storing and reading a data bit. In the embodiment of FIGS. 3a-3d, the bitcell 64 lacks a source-line or select line (SL) signal line typical of many previous existing and proposed bitcells. As explained in greater detail below, by eliminating the SL signal line, the layout restrictions of circuit elements may be relaxed, which may facilitate cell size shrinkage as circuit fabrication processes advance. In addition, the Vc power or ground supply line 210 may be a meshed in the form of a grid to provide increased reliability and stability of bitcell operations such as read operations may be enhanced as well.

In this embodiment, the resistance state ferromagnetic device 70a of a bitcell comprises two layers, a free layer 72a, and a fixed layer 74a (FIG. 4a) of ferromagnetic material separated by an intermediate layer 76 which is a metallic layer in the case of a spin valve or is a thin dielectric or insulating layer in the case of an MTJ. In this example, the layer 72a of ferromagnetic material is contacted by an electrical contact layer 78 and has a first polarization in which the magnetization direction which predominates is in a first but changeable direction. Because the magnetization direction of the layer 72a is changeable, it is referred to as the free layer. In the embodiment of FIG. 4a, the predominant magnetization direction of the free layer 72a of the resistance state ferromagnetic device 70a has a magnetization direction represented by an arrow 80a pointing from right to left in the cross-sectional view of FIG. 4a.

Figure 4B:
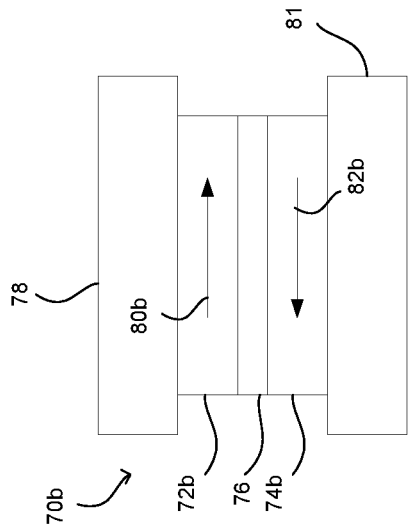
FIGS. 4a, 4b. depict various polarizations of ferromagnetic layers of a ferromagnetic device of a bitcell of the STTRAM memory of FIG. 2.
Figure 4A:
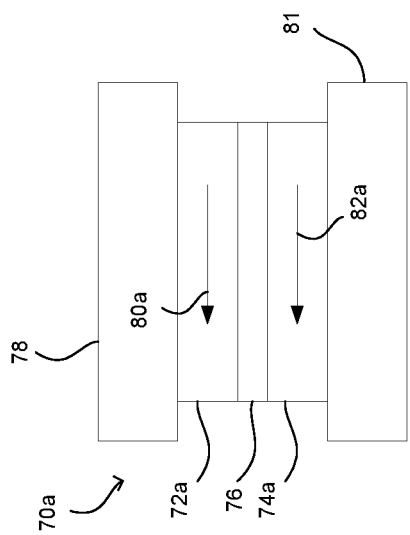

Similarly, the free layer 72b of ferromagnetic material is contacted by an electrical contact layer 78 of the complementary resistance state ferromagnetic device 70b and also has a changeable polarization in which the magnetization direction which predominates, can be caused to be in the same or opposite direction as that of the free layer 72a of the resistance state ferromagnetic device 70a, or can be caused to be in the opposite direction to that of the free layer 72a of the resistance state ferromagnetic device 70a as shown in FIGS. 4a, 4b, for example. Thus, the predominant magnetization direction of the free layer 72b of the resistance state ferromagnetic device 70b has a magnetization direction represented by an arrow 80b pointing from right to left in the cross-sectional view of FIG. 4b.

The other layer 74a, 74b of ferromagnetic material of each resistance state ferromagnetic device 70a, 70b is contacted by an electrical contact layer 81 and is referred to as the "fixed layer" which has a non-changeable polarization in which the predominant magnetization direction of the fixed layer may not be selectively changed. The predominant magnetization direction of the fixed layer 74a of the resistance state ferromagnetic device 70a is represented by an arrow 82a which also points from right to left in the cross-sectional view of FIG. 4a. Similarly, the predominant magnetization direction of the fixed layer 74b of the resistance state ferromagnetic device 70b is represented by an arrow 82b which also points from right to left in the cross-sectional view of FIG. 4b.

In the example of FIG. 4a, the predominant magnetization directions of both the fixed and free layers 74a, 72a of the resistance state ferromagnetic device 70a are depicted as being the same, that is in the same direction. If the predominant magnetization directions of the two ferromagnetic layers 72a, 74a are the same, the polarizations of the two layers are referred to as being "parallel." In the parallel polarization, the bitcell exhibits a low resistance state which may be selected to represent one of a logical one or a logical zero bit state stored in the bitcell.

Conversely, in the example of FIG. 4b, the predominant magnetization directions of both the fixed and free layers 74b, 72b of the complementary resistance state ferromagnetic device 70b are depicted as being opposite, that is in opposite directions. If the predominant magnetization directions of the two ferromagnetic layers are opposite, the polarizations of the two layers 72b, 74b are referred to as being "anti-parallel." In the anti-parallel polarization, the bitcell exhibits a high resistance state which may be selected to represent the other one of a logical one or a logical zero bit state stored in the bitcell.

In the embodiment of FIGS. 4a, 4b, the magnetization directions of the fixed and free layers are depicted as being generally parallel to the contact layers 78, 81. However, it is appreciated that in other embodiments, the magnetization directions of the fixed and free layers may be oriented in other directions such as being generally orthogonal, for example, to the contact layers 78, 81.

Figures 5A, 5B:
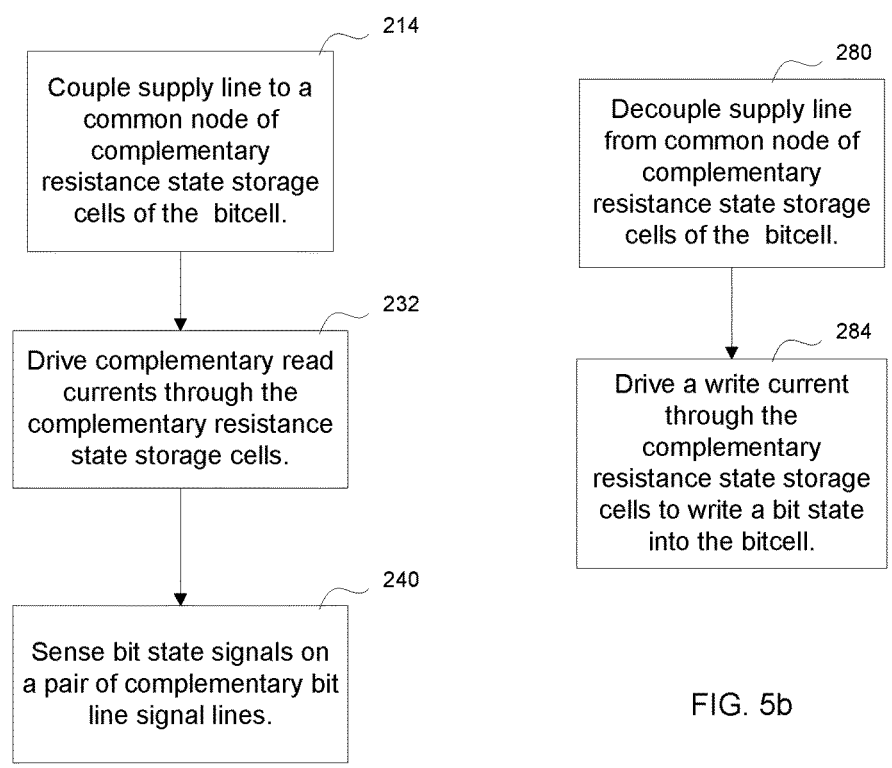
FIG. 5a depicts an embodiment of read operations in a bitcell of the STTRAM memory of FIG. 2.
FIG. 5b depicts an embodiment of write operations in a bitcell of the STTRAM memory of FIG. 2.

FIG. 5a depicts one example of bit state read operations of the supply-switched dual cell memory bitcell 64 (FIG. 4) by the memory control circuit 67 (FIG. 2). In one operation, a supply line such as Vc power supply line 210 (FIG. 3b) is coupled (block 214, FIG. 5a) to a common node 220 (FIG. 3b) of the bitcell 64 by activation of the supply switch transistor 71 which is configured to couple the common node 220 to the supply when activated. In one embodiment, the supply switch transistor 71 is activated by read operation controller logic 212 (FIG. 2) of the memory control circuit 67 which is configured to activate the supply switch transistor 71 by driving a word line read (WLR) signal line 228a (FIG. 3b) coupled to an input 229 of the supply switch transistor 71, to a true state, which turns the supply switch transistor 71 to an ON state, permitting a constant power current I_power to flow from the Vc power supply line 210 through the supply switch transistor 71 to the common node 220.

In response, first and second complementary read currents, I_read1, I_read2, (I_read1+I_read2=I_power), are driven (block 232, FIG. 5a) from the common node 220, through first and second complementary resistance state storage cells, 68a, 68b, respectively, to a pair of first and second complementary bit line BL, /BL signal lines 230a, 230b, respectively, of the bitcell 64. In one embodiment, activation of storage cell switch transistor 69a of the first resistance state storage cell 68a permits the read current I_read1 to pass through the series-connected MTJ 70a and the storage cell switch transistor 69a of the resistance state storage cell 68a, to the bit line BL signal line 230a of the bitcell 64. Thus, the resistance state storage cell 68a has an input coupled to the common node 220 and an output coupled to the bit line BL signal line 230a of the bitcell 64. More specifically, the series-connected MTJ 70a and the storage cell switch transistor 69a of the resistance state storage cell 68a are connected between the common node and 220 and the bit line BL signal line 230a of the bitcell 64.

In one embodiment, the storage cell switch transistor 69a is activated by read operation controller logic 212 (FIG. 2) of the memory control circuit 67, which is configured to drive a word line WL signal line 228b coupled to an input 231a of the storage cell switch transistor 69a, to a true state, which turns the storage cell switch transistor 69a to an ON state, permitting read current I_read1 to flow through the resistance state ferromagnetic device (MTJ) 70a and the storage cell switch transistor 69a to the bit line BL signal line 230a. The read current I_read1 on the bit line BL signal line 230a provides a bit state signal on the bit line BL signal line 230a. Thus, in the embodiment of FIGS. 3a, 3b, the MTJ 70a is coupled at one end to the common node 220 and coupled at the other end to one end of the storage cell switch transistor 69a, which is coupled at its other end to the bit line BL signal line 230a of the bitcell 64.

Similarly, activation of storage cell switch transistor 69b of the first resistance state storage cell permits the complementary read current I_read2 to pass through the series-connected MTJ 70b and the storage cell switch transistor 69b of the complementary resistance state storage cell 68b, to the complementary bit line /BL signal line 230b of the bitcell 64. Thus, the resistance state storage cell 68b has an input coupled to the common node 220 and an output coupled to the bit line /BL signal line 230b of the bitcell 64. More specifically, the series-connected MTJ 70b and the storage cell switch transistor 69b of the resistance state storage cell 68b are connected between the common node and 220 and the bit line /BL signal line 230b of the bitcell 64.

In one embodiment, the storage cell switch transistor 69b is activated by read operation controller logic 212 (FIG. 2) of the memory control circuit 67, which is configured to drive the word line WL signal line 228b coupled to an input 231b of the storage cell switch transistor 69b, to a true state, which turns the storage cell switch transistor 69b to an ON state, permitting read current I_read2 to flow through the resistance state ferromagnetic device (MTJ) 70b and the storage cell switch transistor 69b to the bit line /BL signal line 230b. The read current I_read2 on the complementary bit line /BL signal line 230b provides a complementary state signal on the complementary bit line /BL signal line 230b. Thus, in the embodiment of FIGS. 3a-3d, the MTJ 70b is coupled at one end to the common node 220 and coupled at the other end to one end of the storage cell switch transistor 69b coupled at its other end to the complementary bit line /BL signal line 230b of the bitcell 64.

The complementary bit state signals represented by the complementary read currents I_read1, I_read2, on the complementary bit line BL, /BL signal lines, 230a, 230b, respectively are sensed, that is read (block 240, FIG. 5a) by a suitable sense amplifier. If the resistance state ferromagnetic device 70a has, for example, a parallel polarization such that the resistance state ferromagnetic device 70a exhibits a relatively low resistance (compared to that of the complementary resistance state ferromagnetic device 70b), and the complementary resistance state ferromagnetic device 70b has the complementary anti-parallel polarization such that the resistance state ferromagnetic device 70b exhibits a relatively high resistance (compared to that of the resistance state ferromagnetic device 70a), the current I_read1 on the bit line BL signal line 230a will be sensed as relatively high (compared to that of the complementary current I_read2), and the current I_read2 on the complementary bit line /BL signal line 230b will be sensed as relatively low (compared to that of the current I_read1), and the bit state of the bitcell 64 will be sensed, that is read, as representing a logical one bit state if the low resistance state of the resistance state ferromagnetic device 70a is selected to represent a logical one bit state stored in the bitcell 64.

Conversely, if the resistance state ferromagnetic device 70a has, for example, an anti-parallel polarization such that the resistance state ferromagnetic device 70a exhibits a relatively high resistance (compared to that of the complementary resistance state ferromagnetic device 70b), and the complementary resistance state ferromagnetic device 70b has the complementary parallel polarization such that the resistance state ferromagnetic device 70b exhibits a relatively low resistance (compared to that of the resistance state ferromagnetic device 70a), the current I_read1 on the bit line BL signal line 230a will be sensed as relatively low (compared to that of the complementary current I_read2), and the current I_read2 on the complementary bit line /BL signal line 230b will be sensed as relatively high (compared to that of the current I_read1), and the bit state of the bitcell 64 will be sensed, that is read, as representing a logical zero bit state if the high resistance state of the resistance state ferromagnetic device 70a is selected to represent a logical zero bit state stored in the bitcell 64.

FIG. 5b depicts one example of a write operation to a supply-switched dual cell memory bitcell in accordance with the present description. In one operation, the supply line used for a read operation as discussed above, is decoupled (block 280, FIG. 5b) from the common node of the complementary resistance state storage cells of the bitcell, and an appropriate write current is driven (block 284) through the complementary resistance state storage cells, to write a bit state into the bitcell.

The polarizations of the pair of complementary resistance state ferromagnetic devices 70a, 70b and hence the logical bit value stored in a bitcell 64 of an STTRAM 66 may be set to a particular bit state by passing a spin polarized current in an appropriate direction through the complementary resistance state ferromagnetic devices 70a, 70b of the bitcell 64. A spin polarized current is one in which the spin orientations of the charge carriers (such as electrons) are predominantly of one type, either spin up or spin down.

Thus, a write operation controller logic 290 (FIG. 2) of the control circuit 67 is configured to store a logical one in a bitcell 64 of an STTRAM 66 by passing (block 284, FIG. 5b) spin polarized current I_write1 (FIG. 3c) in one direction (left to right in FIG. 3c) through the complementary resistance state ferromagnetic devices 70a, 70b of the bitcell 64. As a result, the ferromagnetic layers of the resistance state ferromagnetic device 70a of the bitcell 64 have a polarization which is one of parallel or antiparallel, depending upon which polarization state has been selected to represent a logical one, and the ferromagnetic layers of the complementary resistance state ferromagnetic device 70b of the bitcell 64 have a polarization which is the opposite of that of the resistance state ferromagnetic device 70a of the bitcell 64.

Conversely, a logical zero may be stored in a bitcell 64 of an STTRAM 66 by the write operation controller logic 290 (FIG. 2) of the control circuit 67 being configured to pass (block 284, FIG. 5b) spin polarized current I_write2 (FIG. 3d) of the same magnitude as the spin polarized write current I_write1, but in the opposite direction (right to left in FIG. 3d) through the resistance state ferromagnetic devices 70b, 70a of the bitcell. As a result, the ferromagnetic layers of the resistance state ferromagnetic device 70a of the bitcell 64 have a polarization which is the other of parallel or antiparallel, depending upon which polarization has been selected to represent a logical zero, and the ferromagnetic layers of the complementary resistance state ferromagnetic device 70b of the bitcell 64 have a polarization which is the opposite of that of the resistance state ferromagnetic device 70a of the bitcell 64. In one embodiment, the write currents I_write1 and I_write2 may have substantially the same magnitude since they may be directed through the same current path but in opposite directions. In other embodiments, the magnitudes may differ, depending upon the particular application.

In one embodiment, in a write operation directed to the bitcell 64, the switch transistors 69a, 69b are active (block 284, FIG. 5b) and the supply switch transistor 71 is inactive (block 280, FIG. 5b). Activation of both switch transistors 69a and 69b of resistance state storage cells 68a permits the write currents to pass through the switch transistors 69a and 69b and the resistance state ferromagnetic devices 70a, 70b of the bitcell. Deactivating the supply switch transistor 71 decouples (block 280, FIG. 5b) the supply line 210 from the common node 220 and restricts the write current to the dual cells 68a, 68b.

In one embodiment, the switch transistors 69a and 69b are activated by write operation controller logic 290 (FIG. 2) of the memory control circuit 67, which is configured to drive the word line WL signal line 228b coupled to the inputs 231a, 231b of the switch transistors 69a and 69b, respectively, to a true state, which turns the switch transistors 69a, 69b to an ON state, permitting the write current to pass through the switch transistors 69a and 69b and the resistance state ferromagnetic devices 70a, 70b of the bitcell 64. The supply switch transistor 71 is maintained inactive by write operation controller logic 290 (FIG. 2) of the memory control circuit 67, which is configured to drive the word line read WLR signal line 228a coupled to the input 229 of the supply switch transistor 71 to the complementary state, which turns the supply switch transistor 71 to the OFF state, decoupling the supply line from the common node, thereby preventing write current from passing through the supply switch transistor 71 during the write operation of the bitcell 64. In addition, the OFF state of the supply switch transistor 71, also prevents power supply current from the Vc power supply line 210 from passing through the supply switch transistor 71 during the write operation of the bitcell 64.

The write operation controller logic 290 (FIG. 2) of the control circuit 67 is configured to selectively direct a spin polarized write current through the dual cells 68a, 68b to write a particular bit state into the bitcell 64 by providing appropriate signals on the bit line BL signal line 230a and the complementary bit line /BL signal line 230b. Thus, to store a logical one in a bitcell 64 of an STTRAM 66 by passing (block 284, FIG. 5b) spin polarized current I_write1 (FIG. 3c) in one direction (left to right in FIG. 3c) through the complementary resistance state ferromagnetic devices 70a, 70b of the bitcell 64, the bit line BL signal line 230a may be raised by the write operation controller logic 290 (FIG. 2) to a higher potential than that of complementary bit line /BL signal line 230b. Conversely, to store a logical zero in a bitcell 64 of an STTRAM 66 by passing (block 284, FIG. 5b) spin polarized current I_write2 (FIG. 3d) in the other direction (right to left in FIG. 3d) through the complementary resistance state ferromagnetic devices 70b, 70a of the bitcell 64, the complementary bit line /BL signal line 230b may be raised by the write operation controller logic 290 (FIG. 2) to a higher potential than that of the bit line BL signal line 230a.

Figure 6:
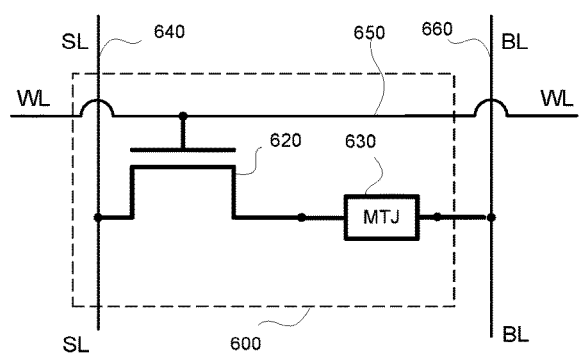
FIG. 6 depicts an example of a prior art bitcell of an STTRAM memory.

It is seen from the above that a supply-switched dual cell memory bitcell 64 of FIGS. 3a-3d may be both read from and written to without the use of source or select SL line signal lines utilized by various previous existing and proposed bitcells. For example, FIG. 6 depicts a known bitcell 600 having a switch transistor 620 and a magnetic-tunneling junction 630 in which a select line SL signal line 640 is used in both read and write operations. The bit state of the bitcell 600 is read by providing a read signal on the select line SL signal line 640, and activating the switch transistor 620 with an activation signal on a word line WL signal line 650. The bit state signal on a bit line BL signal line 660 is compared to a reference signal (not shown). A logical bit value may be written to the bitcell 600 by activating the switch transistor 620 with an activation signal on the word line WL signal line 650, and providing appropriate signals on the select line SL signal line 640 and the bit line BL signal line 660 to selectively direct a spin polarized write current through the MTJ 630 to write a particular bit state into the bitcell 600. Thus, to store a logical one in a bitcell 600 of an STTRAM, the bit line BL signal line 660 may be raised to a higher potential than that of select line SL signal line 640. Conversely, to store a logical zero in the bitcell 600 of an STTRAM, the select line SL signal line 640 may be raised to a higher potential than that of bit line BL signal line 660.

Figure 7:
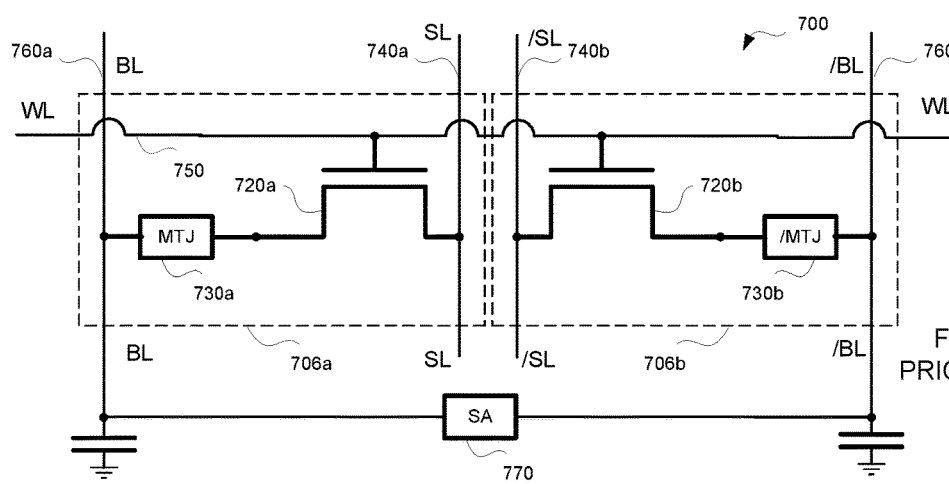
FIG. 7 depicts another example of a prior art bitcell of an STTRAM memory.

FIG. 7 shows another example of a previously proposed bitcell in which select line SL signal lines are used in both read and write operations. In this example, a previously proposed bitcell 700 has dual MTJ cells 706a, 706b, each of which has a switch transistor 720a, 720b and a magnetic-tunneling junction 730a, 730b in which a select line SL signal line 740a and a select line /SL signal line 740b are used in both read and write operations. The bit state of the bitcell 700 is read by providing read signals on both select line SL signal line 740a and complementary select line /SL signal line 740b and by activating the switch transistors 720a, 720b with an activation signal on a word line WL signal line 750. The bit state signal on a bit line BL signal line 760a is compared to a bit state signal on a complementary bit line /BL signal line 760b, using a sense amplifier 770.

A logical bit value may be written to the bitcell 700 by activating the switch transistors 720a, 720b with an activation signal on the word line WL signal line 750, and providing appropriate signals on select line SL signal line 740a, complementary select line /SL signal line 740b, bit line BL signal line 760a, and bit line /BL signal line 760b, to selectively direct spin polarized write currents through the MTJs 730a, 730b to write a particular bit state into the bitcell 700. Thus, to store a logical one in a bitcell 700 of an STTRAM, the bit line BL signal line 760a of the MTJ cell 706a may be raised to a higher potential write signal such as V_write, for example, and the select line SL signal line 740a of the MTJ cell 706a lowered to a lower potential such as zero volts, for example. In addition, the select line /SL signal line 740b of the MTJ cell 706b may be raised to a higher potential write signal such as V_write, for example, and the bit line /BL signal line 760b of the MTJ cell 706b lowered to a lower potential such as zero volts, for example.

Conversely, to store a logical zero in the bitcell 700 of an STTRAM, the select line SL signal line 740a of the MTJ cell 706a may be raised to a higher potential write signal such as V_write, for example, and the bit line BL signal line 760a of the MTJ cell 706a lowered to a lower potential such as zero volts, for example. In addition, the bit line /BL signal line 760b of the MTJ cell 706b may be raised to a higher potential write signal such as V_write, for example, and the select line /SL signal line 740b of the MTJ cell 706b lowered to a lower potential such as zero volts, for example.

Compared to the single MTJ cell structure of FIG. 6, the dual MTJ cell structure of the bitcell of FIG. 7 can provide a larger sensing margin for faster sense and read operation. In addition the complementary bit lines BL, /BL provide complementary bit state information which can eliminate use of a reference voltage or current for read operations. However, both the single MTJ cell structure of the bitcell of FIG. 6, and the dual MTJ cell structure of the bitcell of FIG. 7 utilize one or more select line SL signal lines for both read and write operations.

Figure 8A:
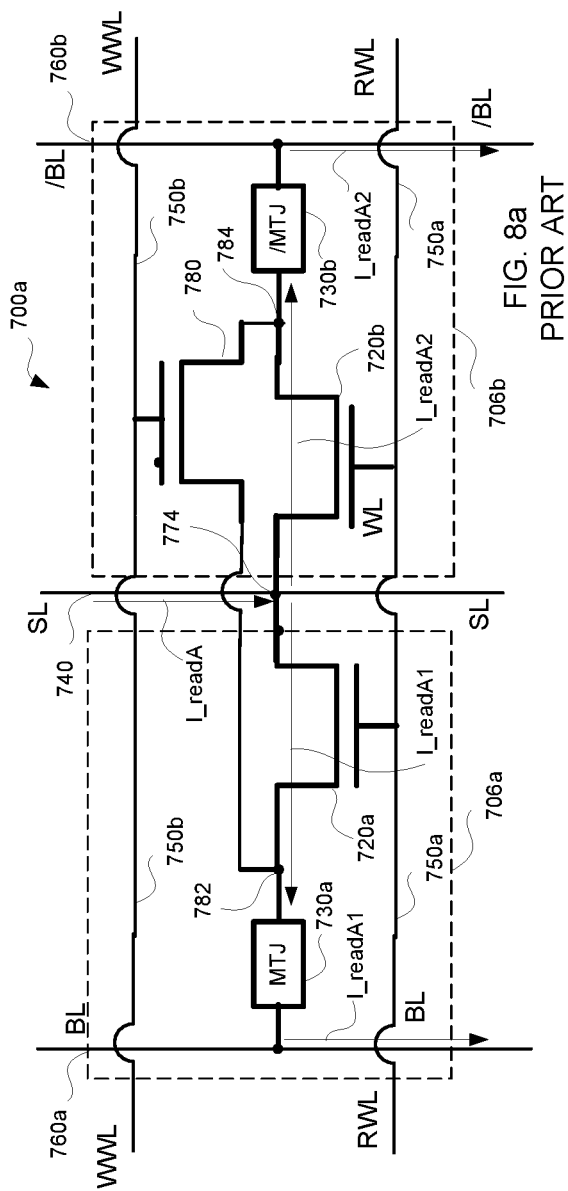
FIGS. 8a-8c depict another example of a prior art bitcell of an STTRAM memory.
Figure 8B:
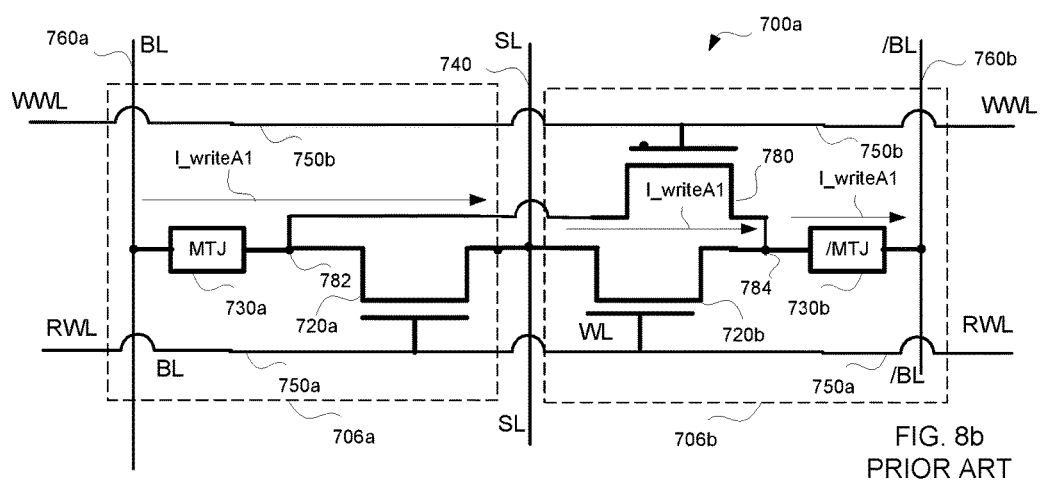
Figure 8C:
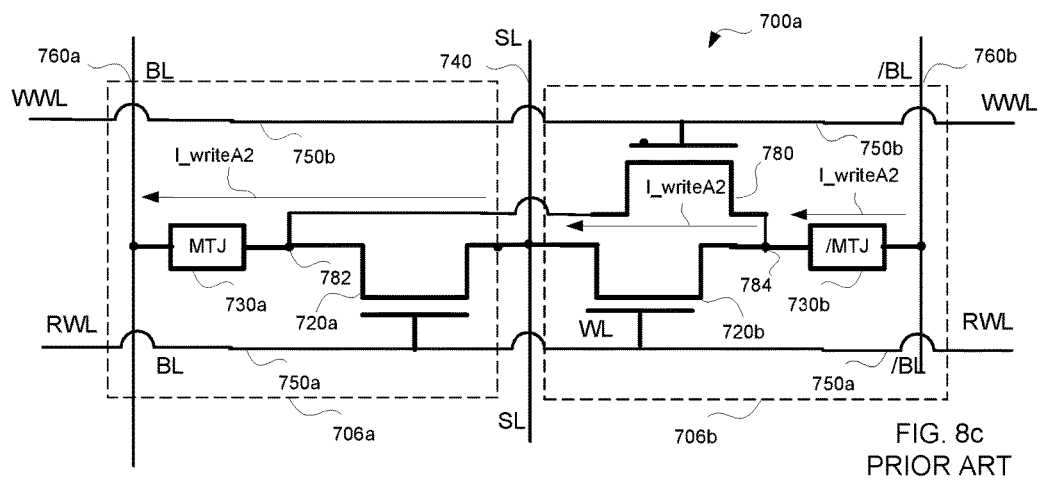

FIGS. 8a-8c show another example of a previously proposed bitcell in which a select line SL signal line is used in both read and write operations. In this example, a previously proposed bitcell 700a, like the bitcell 700 of FIG. 7, has dual MTJ cells 706a, 706b, each of which has a switch transistor 720a, 720b and a magnetic-tunneling junction 730a, 730b. However, rather than both a select line SL signal line 740a and a complementary select line /SL signal line 740b of FIG. 7, the bitcell 700a of FIG. 8a employs a single combined select line SL signal line 740 in both read and write operations.

The bit state of the bitcell 700a is read by providing a read signal I_readA on the select line SL signal line 740 coupled at a common node 774 of the switch transistors 720a, 720b of the MTJ cells 706a, 706b. In addition, the switch transistors 720a, 720b are activated with an activation signal on a read word line RWL signal line 750a. The resultant bit state signal I_readA1 on a bit line BL signal line 760a, is compared to the resultant complementary bit state signal I_readA2 on a complementary bit line /BL signal line 760b, using a sense amplifier such as the amplifier 770 of FIG. 7.

Referring to FIGS. 8b, 8c, write operations directed to the bitcell 700a include activating a third switch transistor 780 which is coupled at one end to a node 782 between the MTJ 730a and the switch transistor 720a, and is coupled at its other end to a node 784 between the switch transistor 720b and the MTJ 730b. When activated, the switch transistor 780 bypasses the switch transistors 720a, 720b. The switch transistor 780 is activated with an activation signal on a write word line WWL signal line 750b. To store a bit state in the bitcell 700a, the switch transistor 780 is activated and appropriate signals are provided on bit line BL signal line 760a, and complementary bit line /BL signal line 760b, to selectively direct spin polarized write currents through the MTJs 730a, 730b to write a particular bit state into the bitcell 700.

Thus, to store a logical one in a bitcell 700a of an STTRAM, the bit line BL signal line 760a of the MTJ cell 706a may be raised to a higher potential write signal such as V_write, for example, and the complementary bit line /BL signal line 760b of the bitcell 700a lowered to a lower potential such as zero volts, for example. As a result, a spin polarized write current I_writeA1 (FIG. 8b) passes through (in a left to right direction in the view of FIG. 8b) through the MTJ 730a, through the switch transistor 780 and through the MJT 730b to write a particular bit state such as a logical one value, into the bitcell 700a.

Conversely, to store a logical zero in the bitcell 700a of an STTRAM, the complementary bit line /BL signal line 760b of the MTJ cell 706b may be raised to a higher potential write signal such as V_write, for example, and the bit line BL signal line 760a of the MTJ cell 706a may be lowered to a lower potential such as zero volts, for example. As a result, a spin polarized write current I_writeA2 (FIG. 8c) passes through (in a right to left direction in the view of FIG. 8c) through the MTJ 730b, through the switch transistor 780 and through the MJT 730a to write a particular bit state such as a logical zero value, into the bitcell 700a.

Compared to the dual MTJ cell structure of the bitcell of FIG. 7, the dual MTJ cell structure of the bitcell of FIGS. 8a-8c may have a lower write current since both MTJs 730a, 730b are in the write path I_writeA1 (FIG. 8b) or write path I_writeA2 (FIG. 8c). In addition, the number of column oriented signal lines is reduced from four signal lines (SL, /SL, BL, /BL) in the bitcell of FIG. 7, to three column oriented signal lines, (SL, BL, /BL) in the bitcell of FIGS. 8a-8c. However, in a bitcell in accordance with one aspect of the present description such as bitcell 64 (FIGS. 3a-3d), both column oriented signal lines SL, /SL can be eliminated, reducing the number of column oriented signal lines to two (BL, /BL) as shown for the bitcell 64 of FIGS. 3a-3d, for example. As a result, layout restrictions of circuit elements may be relaxed, which may facilitate cell size shrinkage as circuit fabrication processes advance.

In addition, in a bitcell in accordance with another aspect of the present description, the supply line such as the Vc power supply line 210 (FIGS. 3a-3d) may be a mesh of supply lines in the form of a grid to provide increased reliability and stability of bitcell operations such as read operations, as compared to many previous bitcell designs. For example, it is appreciated herein that in the bitcell 700a of FIG. 8a, the read current I_readA flowing through the combined select line SL signal line 740 may be almost double the read current of other bitcells. As a result, the width of the combined select line SL signal line 740 may be substantially wider than prior select line SL signal lines to reduce resistance of the select line SL signal line 740 to accommodate the increased read current.

Figure 9:
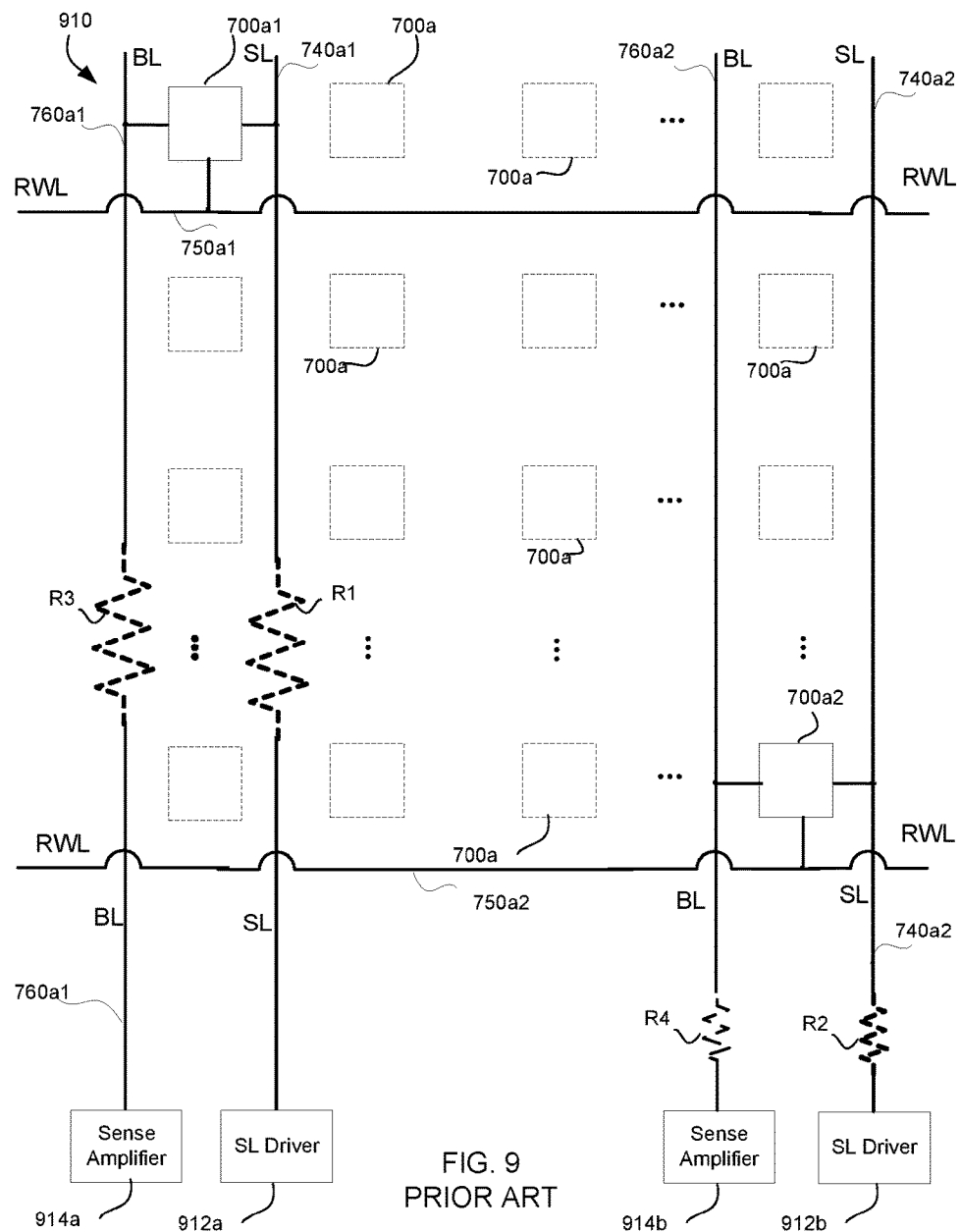
FIG. 9 depicts a prior art array of the prior art bitcells of FIGS. 8a-8c.

It is further appreciated herein that use of select line SL signal lines in a memory can have an adverse effect upon read margins. FIG. 9 shows an example of a memory array 910 of bitcells 700a similar to the prior bitcells 700a of FIGS. 8a-8c, utilizing columnar select line SL signal lines such as select line SL signal line 740a1, for example, adjacent a column of bitcells 700a including a bitcell 700a1, for example, and select line SL signal line 740a2, for example, adjacent a column of bitcells 700a including a bitcell 700a2, for example. (The select line SL signal lines 740 (FIG. 8a) for the remaining columns of the array 910 of bitcells 700a are omitted for purposes of clarity.) Also depicted are row read word line RWL signal lines such as row read word line RWL signal line 750a1, for example, adjacent a row of bitcells 700a including the bitcell 700a1, for example, and row read word line RWL signal line 750a2, for example, adjacent a row of bitcells 700a including a bitcell 700a2, for example. (The complementary column bit line /BL (FIG. 8a) signal lines and row write word line WWL (FIG. 8a) signal lines are omitted from FIG. 9 for purposes of clarity.)

As shown in FIG. 9, the positions of the bitcells 700a1 and 700a2 are different within the array 910. Thus, the length along the select line SL signal line 740a1 from a select line SL driver 912a to the bitcell 700a1 is significantly longer than the length along the select line SL signal line 740a2 from a select line SL driver 912b to the bitcell 700a2. Hence, the parasitic resistance of that portion of the select line SL signal line 740a1 from the select line SL driver 912a to the bitcell 700a1 as represented by the resistor R1 depicted in phantom, is substantially larger than the parasitic resistance of that portion of the select line SL signal line 740a2 from the select line SL driver 912b to the bitcell 700a2 as represented by the resistor R2 depicted in phantom. In a similar manner, the parasitic resistance of that portion of the bit line BL signal line 760a1 from the bitcell 700a1 to a sense amplifier 914a as represented by the resistor R3 depicted in phantom, is substantially larger than the parasitic resistance of that portion of the bit line BL signal line 760a2 from the bitcell 700a2 to a sense amplifier 914b as represented by the resistor R4 depicted in phantom.

It is seen that the total resistance of the read signal path through the parasitic resistance R1, the bitcell 700a1 and the parasitic resistance R3 is substantially higher than that of the read signal path through the parasitic resistance R2, the bitcell 700a2 and the parasitic resistance R4, notwithstanding that the resistances of the MTJ cells 706a, 706b (FIG. 8a) of the bitcells 700a1, 700a2 may be substantially identical. These differences in total resistances in the read paths as a function of bitcell position within the array 910 may cause degradation in read margins and may cause read accuracy failures. Such degradation and failures may be further aggravated by variations in resistance due to fabrication process variations.

As explained in greater detail below, by eliminating the SL signal line in an array of supply-switched dual cell memory bitcells 64 in accordance with the present description, the layout restrictions of circuit elements may be relaxed, which may facilitate cell size shrinkage as circuit fabrication processes advance. In addition, the supply line may be a mesh of supply lines in the form of a grid of supply lines to provide increased reliability and stability of bitcell operations such as read operations.

Figure 3D:
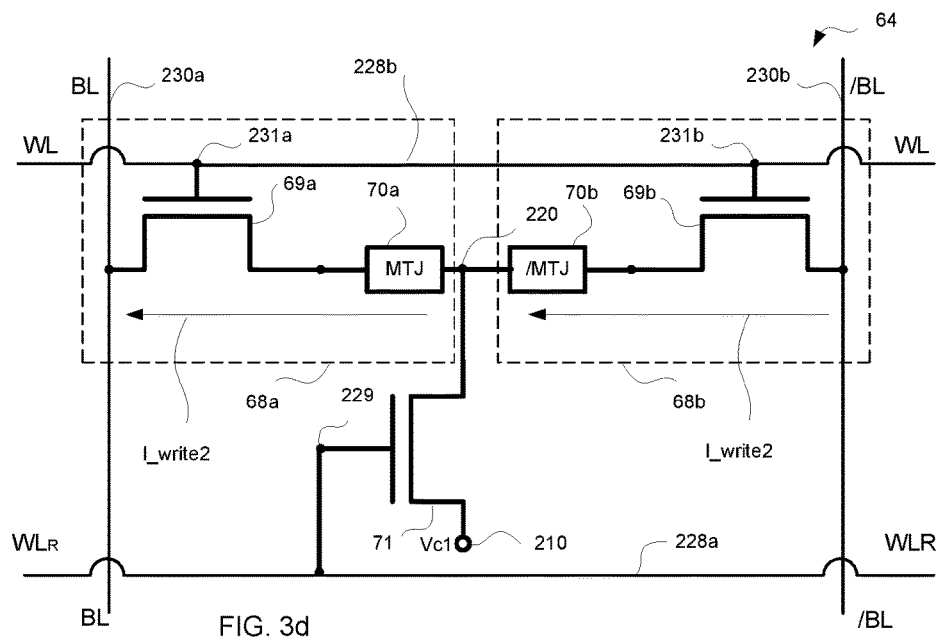
Figure 10:
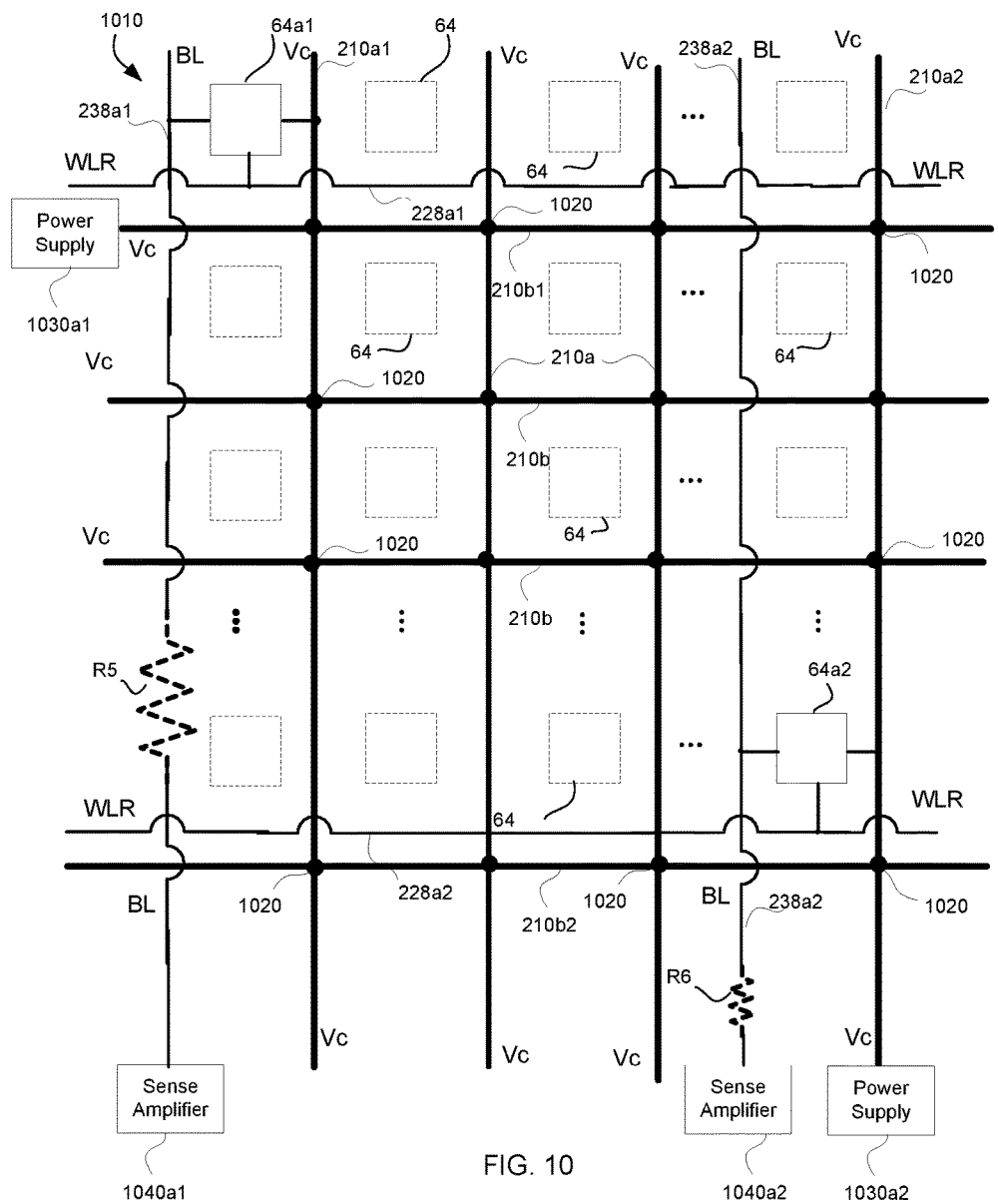
FIG. 10 depicts an array of bitcells of FIGS. 3a-3d in accordance with an embodiment of the present disclosure.

FIG. 10 shows an example of a memory array 1010 of bitcells 64 similar to the bitcells 64 of FIGS. 3s-3d, in which columnar select line SL signal lines of prior bitcells such as the select line SL signal lines of FIG. 9, have been eliminated. In one aspect of a memory employing supply-switched dual cell memory bitcells 64 in accordance with the present description, the Vc power supply line 210 (FIG. 3b) is depicted in FIG. 10 in the form of an orthogonal mesh or grid 210 of a set of columnar power supply lines 210a interconnected at nodes 1020 with a set of row power supply lines 210b as shown in FIG. 10. The orthogonal sets of power supply lines 210a, 210b of the power supply line grid 210 are substantially equipotential at a power supply voltage Vc provided by one or more power supplies 1030a1, 1030a2 which may be a constant current or constant voltage power supply, for example.

In one embodiment, a columnar power supply line 210a may be provided adjacent each column of bitcells 64 of the array 1010. For example, a columnar power supply line 210a1 of the set of parallel, spaced power supply lines 210a may be provided adjacent a column of bitcells 64 including a bitcell 64a1, for example, and a columnar power supply line 210a2 of the set of parallel, spaced power supply lines 210a may be provided adjacent a column of bitcells 64 including a bitcell 64a2, for example. In addition, a row power supply line of a set of parallel, spaced row power supply lines 210b may be provided adjacent each row of bitcells 64 of the array 1010. For example, a row power supply line 210b1 of the set of row power supply lines 210b may be provided adjacent a row of bitcells 64 including the bitcell 64a1, for example, and a row power supply line 210b2 of the set of row power supply lines 210b may be provided adjacent a row of bitcells 64 including the bitcell 64a2, for example.

In this embodiment, the set of columnar power supply lines 210a is arranged in a column direction and the set of row power supply lines 210b is arranged in a row direction orthogonal to the column direction of the set of power supply lines 210a. In one aspect of the present description, it is appreciated that the grid-like structure of the power supply lines 210a, 210b not only reduces the overall resistance of the grid 210 of power supply lines, but also increases the uniformity of the resistances of the various current paths through the grid 210, notwithstanding differences in array position of the bitcells 64. In addition, it is appreciated that the grid-like structure of the power supply lines 210a, 210b increases the overall capacitance of the power supply lines 210a, 210b which can increase the stability of the power supply 1030a1, 1030a2. As a result, it is appreciated that overall accuracy and stability of read operations may be enhanced as well.

Also depicted are examples of a set of parallel, spaced bit line BL (FIG. 3a) signal lines including a column bit line BL signal line 238a1, for example, adjacent a column of bitcells 64 including the bitcell 64a1, for example, and a column bit line BL signal line 238a2, for example, adjacent the column of bitcells 64 including the bitcell 64a2, for example. (The column bit line BL signal lines of the set of bit line BL signal lines for the remaining columns of the array 1010 of bitcells 64 are omitted for purposes of clarity.)

Also depicted are examples of a set of parallel, spaced row read word line WLR (FIG. 3a) signal lines including row read word lines such as row read word line WLR signal line 228a1, for example, adjacent a row of bitcells 64 including the bitcell 64a1, for example, and row read word line WLR signal line 228a2, for example, adjacent a row of bitcells 64 including the bitcell 64a2, for example. (The row read word line WLR signal lines for the remaining rows of the array 1010 of bitcells 64 are omitted for purposes of clarity.)

In this embodiment, the sets of columnar bit line BL and /BL signal lines are arranged in a column direction and the sets of row read and write word line WLR, WLW signal lines are arranged in a row direction orthogonal to the column direction of the sets of bit line signal lines. (The set of column complementary bit line /BL (FIG. 3a) signal lines and the set of row write word line WWL (FIG. 3a) signal lines are omitted from FIG. 10 for purposes of clarity.)

As shown in FIG. 10, the positions of the bitcells 64a1 and 64a2 are different within the array 910. However, due to the grid structure of the grid 210 of power supply lines 210a, 210b, the lengths of the current paths from a power supply such as power supply 1030a1, through the grid 210 to the bitcell 64a1 may have increased uniformity with respect to the lengths of the current paths from a power supply such as power supply 1030a2, through the grid 210 to the bitcell 700a2, for example. Hence, the parasitic resistances of the grid 210 may not only be reduced as noted above as compared to those of the SL signal lines of prior bitcells, but may also be more uniform as compared to those of the SL signal lines of prior bitcells, notwithstanding differences in bitcell position within the array 1010. Hence, due to increased uniformity of parasitic resistances of current paths through the grid 210, the overall parasitic resistances of a read current path through the grid 210 to the bitcell 64a1, for example, and through the parasitic resistance R5 of the bit line BL signal line 238a1 to a sense amplifier 1040a1, may have increased uniformity with respect to the overall parasitic resistances of a read current path through the power supply line grid 210 to the bitcell 64a2 and through the parasitic resistance R6 of the bit line BL signal line 238a2 to a sense amplifier 1040a2, notwithstanding the difference in parasitic resistances between the parasitic resistance R5 of the bit line BL signal line 238a1, and the parasitic resistance R6 of the bit line BL signal line 238a2. The increased uniformity in total resistance in the read paths notwithstanding bitcell position within the array 1010 may enhance read margins and accuracy in read operations. Such read operation enhancements may increase toleration to variations in resistance due to fabrication process variations.

Figure 11A:
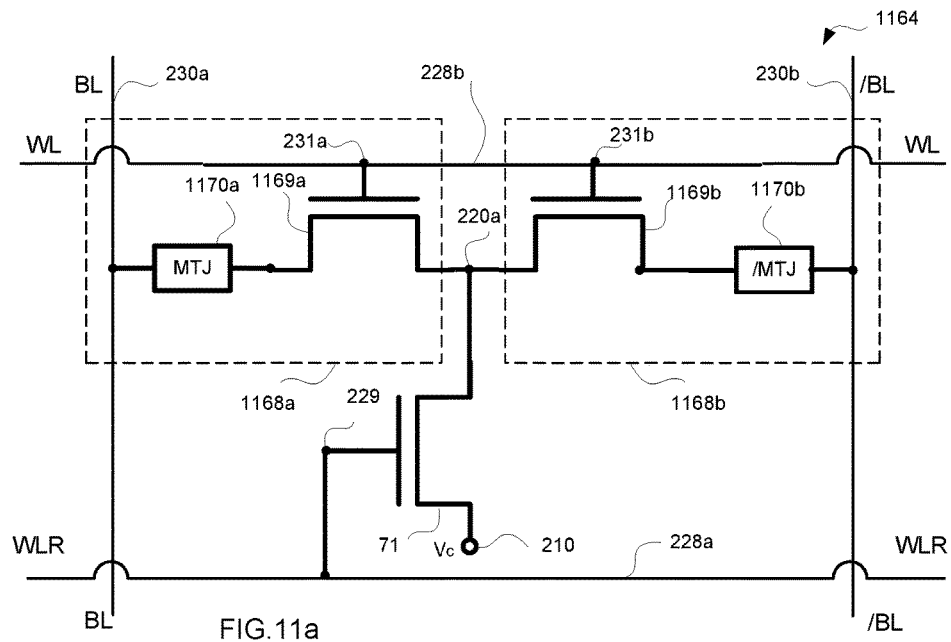
FIGS. 11a-11d depict another embodiment of a supply-switched dual cell memory bitcell in accordance with the present description.
Figure 11B:
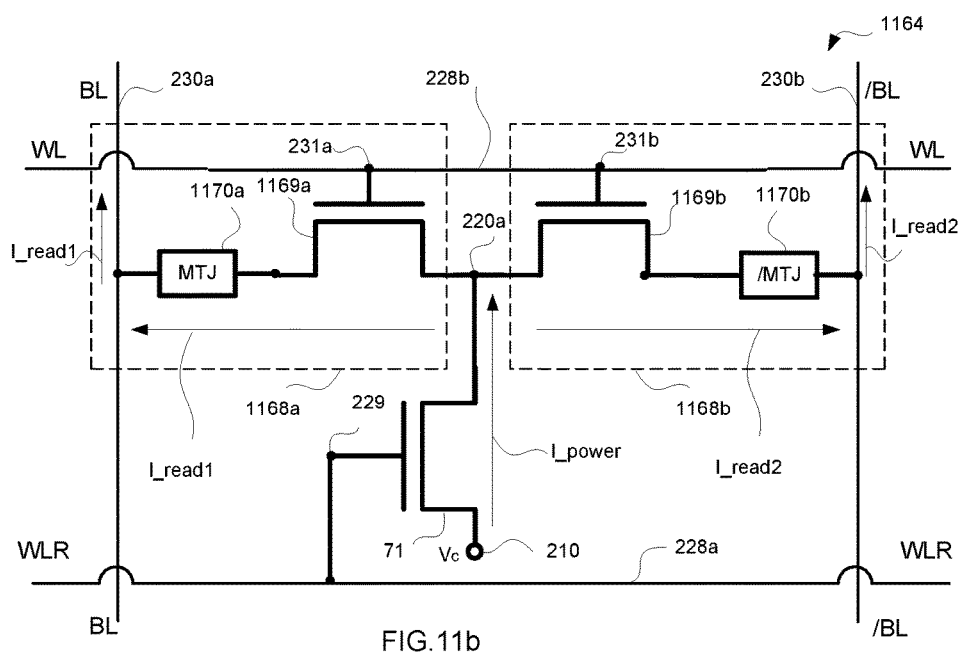
Figure 11C:
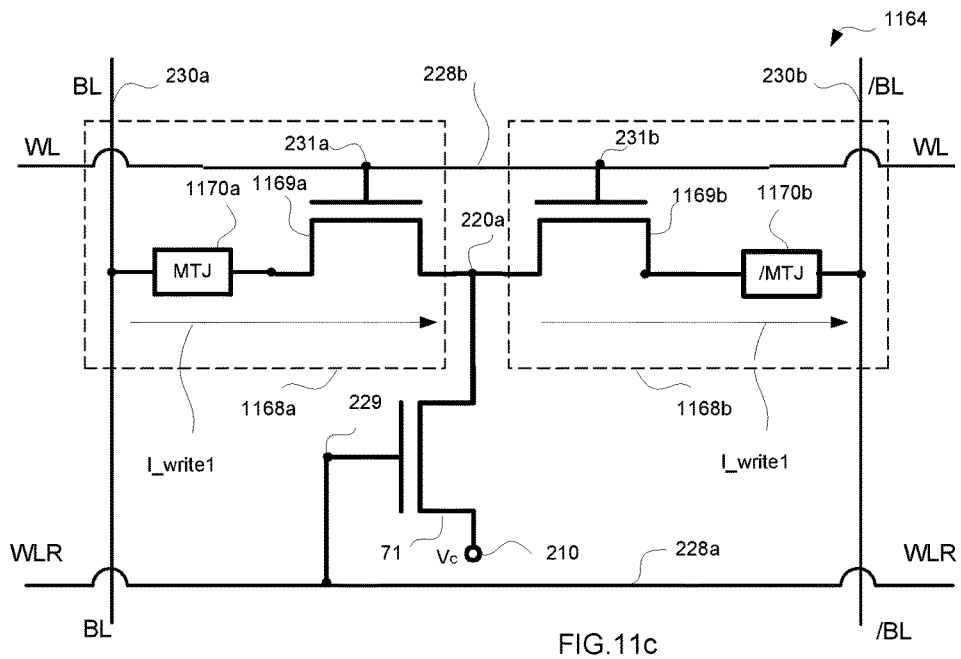
Figure 11D:
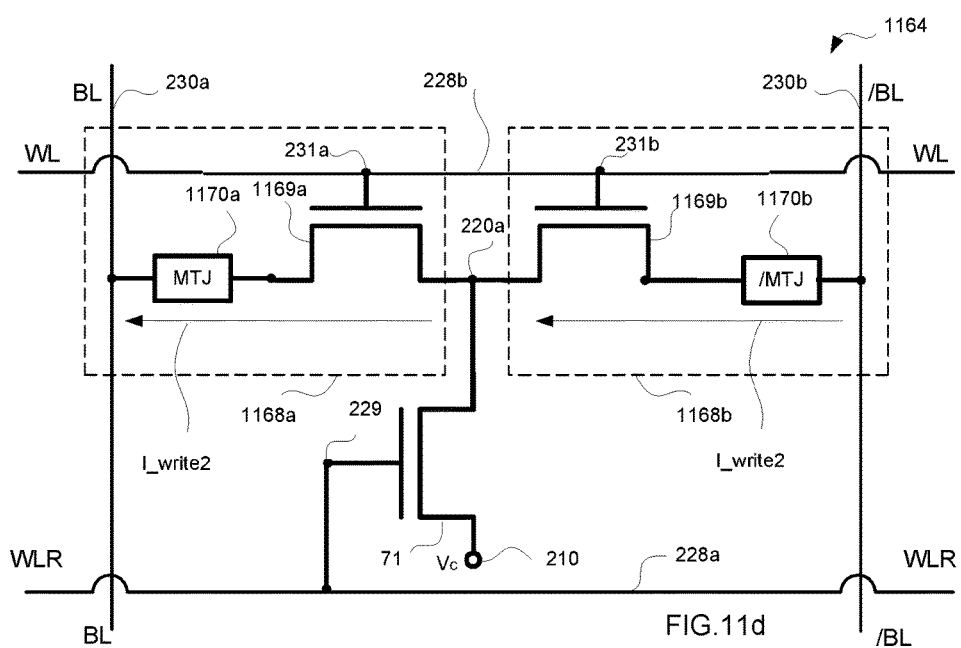

FIG. 11a-11d are directed to another embodiment of a supply-switched dual cell memory bitcell 1164 in accordance with the present description. In this embodiment, each bitcell 1164 of the array 60 (FIG. 2) of bitcells 1164, like the bitcells 64 of FIGS. 3a-3d, includes a complementary pair of resistance state storage cells 1168a, 1168b (FIG. 11a-11d), each of which includes a storage cell switch transistor 1169a, 1169b series connected to a resistance state ferromagnetic device 1170a, 1170b such as a spin valve, or a magnetic tunnel junction (MTJ) device as shown in FIG. 11a. However, in this embodiment, the positions of the series-connected switch transistors 1169a, 1169b and resistance state ferromagnetic device 1170a, 1170b are switched relative to the positions of the series-connected switch transistors 69a, 69b and resistance state ferromagnetic device 70a, 70b of the complementary pair of resistance state storage cells 68a, 68b (FIG. 3a-3d). Thus, in this embodiment, the switch transistors 69a, 69b are connected to a common node 220a, and the resistance state ferromagnetic devices (MTJs) 70a, 70b are connected to bit line signal lines BL 230a, /BL 230b, respectively, as shown in FIGS. 11a-11d.

Like the bitcell 64 of FIGS. 3a-3d, the bitcell 1164 of FIGS. 11a-11d has a supply switch transistor 71 which selectively couples a supply line such as a Vc constant voltage or current line 210 to the dual cells 1168a, 1168b for read operations as explained in greater detail below. Also, like the bitcell 64 of FIGS. 3a-3d, the supply-switched dual cell memory bitcell 1164 of FIGS. 11a-11d has a reduced number of signal lines for storing and reading a data bit. In the embodiment of FIGS. 11a-11d, the bitcell 1164 lacks a source-line or select line (SL) signal line typical of many previous existing and proposed bitcells.

The read and write operations of the supply-switched dual cell memory bitcell 1164 of FIGS. 11a-11d are similar to those described above in connection with the supply-switched dual cell memory bitcell 64 of FIGS. 3a-3d. Accordingly, in one operation, a supply line such as Vc power supply line 210 (FIG. 3b) is coupled (block 214, FIG. 5a) to a common node 220 (FIG. 3b) of the bitcell 64 by activation of the supply switch transistor 71. Here too, in one embodiment, the supply switch transistor 71 is activated by read operation controller logic 212 (FIG. 2) of the memory control circuit 67, configured to drive a word line read (WLR) signal line 228a coupled to an input 229 of the supply switch transistor 71, to a true state, which turns the supply switch transistor 71 to an ON state, permitting a constant power current I_power (FIG. 11b) to flow from the Vc power supply line 210 through the supply switch transistor 71 to the common node 220a.

In response, first and second complementary read currents, I_read1, I_read2, (I_read1+I_read2=I_power), are driven (block 232, FIG. 5a) from the common node 220a, through first and second complementary resistance state storage cells, 1168a, 1168b, respectively, to a pair of first and second complementary bit line BL, /BL signal lines 230a, 230b, respectively, of the bitcell 1164.

In one embodiment, the storage cell switch transistor 1169a is activated by read operation controller logic 212 (FIG. 2) of the memory control circuit 67, which is configured to drive a word line WL signal line 228b coupled to an input 231a of the storage cell switch transistor 1169a, to a true state, which turns the storage cell switch transistor 1169a to an ON state, permitting read current I_read1 to flow through the storage cell switch transistor 1169a and the resistance state ferromagnetic device (MTJ) 1170a to the bit line BL signal line 230a. The read current I_read1 on the bit line BL signal line 230a provides a bit state signal on the bit line BL signal line 230a. Thus, in the embodiment of FIGS. 11a, 11b, the storage cell switch transistor 1169a is coupled at one end to the common node 220a and coupled at the other end to one end of the MTJ 1170a, which is coupled at its other end to the bit line BL signal line 230a of the bitcell 1164.

Similarly, activation of storage cell switch transistor 1169b of the second resistance state storage cell permits the complementary read current I_read2 to pass through the series-connected storage cell switch transistor 1169b and the MTJ 1170b of the complementary resistance state storage cell 1168b, to the complementary bit line /BL signal line 230b of the bitcell 1164. Thus, the resistance state storage cell 1168b has an input coupled to the common node 220a and an output coupled to the bit line /BL signal line 230b of the bitcell 1164. More specifically, the series-connected storage cell switch transistor 1169b and MTJ 1170b of the resistance state storage cell 1168b are connected between the common node 220a and the bit line /BL signal line 230b of the bitcell 1164.

In one embodiment, the storage cell switch transistor 1169b is activated by read operation controller logic 212 (FIG. 2) of the memory control circuit 67, which is configured to drive the word line WL signal line 228b coupled to an input 231b of the storage cell switch transistor 1169b, to a true state, which turns the storage cell switch transistor 1169b to an ON state, permitting read current I_read2 to flow through the storage cell switch transistor 1169b and the resistance state ferromagnetic device (MTJ) 1170b to the bit line /BL signal line 230b. The read current I_read2 on the complementary bit line /BL signal line 230b provides a complementary state signal on the complementary bit line /BL signal line 230b. Thus, in the embodiment of FIGS. 11a-11d, the storage cell switch transistor 1169b is coupled at one end to the common node 220a and coupled at the other end to one end of the MTJ 1170b, which is coupled at its other end to the complementary bit line /BL signal line 230b of the bitcell 1164. The complementary bit state signals represented by the complementary read currents I_read1, I_read2, on the complementary bit line BL, /BL signal lines, 230a, 230b, respectively are sensed (block 240, FIG. 5a) by a suitable sense amplifier.

FIG. 5b also depicts one example of a write operation to a supply-switched dual cell memory bitcell 1164 in accordance with the present description. In one operation, the supply line used for a read operation as discussed above, is decoupled (block 280, FIG. 5b) from the common node of the complementary resistance state storage cells of the bitcell, and an appropriate write current is driven (block 284) through the complementary resistance state storage cells, to write a bit state into the bitcell.

Thus, a write operation controller logic 290 (FIG. 2) of the control circuit 67 is configured to store a logical one in a bitcell 1164 of an STTRAM such as the STTRAM 66 by passing (block 284, FIG. 5b) spin polarized current I_write1 (FIG. 11c) in one direction (right to left in FIG. 11c) through the complementary resistance state ferromagnetic devices 1170a, 1170b of the bitcell 64. As a result, the ferromagnetic layers of the resistance state ferromagnetic device 1170a of the bitcell 1164 have a polarization which is one of parallel or antiparallel, depending upon which polarization state has been selected to represent a logical one, and the ferromagnetic layers of the complementary resistance state ferromagnetic device 1170b of the bitcell 1164 have a polarization which is the opposite of that of the resistance state ferromagnetic device 1170a of the bitcell 1164.

Conversely, a logical zero may be stored in a bitcell 1164 of an STTRAM 66 by the write operation controller logic 290 (FIG. 2) of the control circuit 67 being configured to pass (block 284, FIG. 5b) spin polarized current I_write2

(FIG. 11d) in the opposite direction (right to left in FIG. 11d) through the resistance state ferromagnetic devices 1170a, 1170b of the bitcell. As a result, the ferromagnetic layers of the resistance state ferromagnetic device 1170a of the bitcell 1164 have a polarization which is the other of parallel or antiparallel, depending upon which polarization has been selected to represent a logical zero, and the ferromagnetic layers of the complementary resistance state ferromagnetic device 1170b of the bitcell 1164 have a polarization which is the opposite of that of the resistance state ferromagnetic device 1170a of the bitcell 1164.

In one embodiment, in a write operation directed to the bitcell 1164, the switch transistors 1169a, 1169b are active (block 284, FIG. 5b) and the supply switch transistor 71 is inactive (block 280, FIG. 5b). Activation of both switch transistors 1169a and 1169b of resistance state storage cells 1168a permits the write currents to pass through the switch transistors 1169a and 1169b and the resistance state ferromagnetic devices 1170a, 1170b of the bitcell. Deactivating the supply switch transistor 71 decouples (block 280, FIG. 5b) the supply line 210 from the common node 220a and restricts the write current to the dual cells 1168a, 1168b.

In one embodiment, the switch transistors 1169a and 1169b are activated by write operation controller logic 290 (FIG. 2) of the memory control circuit 67, which is configured to drive the word line WL signal line 228b coupled to the inputs 231a, 231b of the switch transistors 1169a and 1169b, respectively, to a true state, which turns the switch transistors 1169a, 1169b to an ON state, permitting the write current pass through the switch transistors 1169a and 1169b and the resistance state ferromagnetic devices 1170a, 1170b of the bitcell 1164. The supply switch transistor 71 is maintained inactive by write operation controller logic 290 (FIG. 2) of the memory control circuit 67, which is configured to drive the word line read WLR signal line 228a coupled to the input 229 of the supply switch transistor 71 to the complementary state, which turns the supply switch transistor 71 to the OFF state, preventing write current from passing through the supply switch transistor 71 during the write operation of the bitcell 1164. In addition, the OFF state of the supply switch transistor 71, also prevents power supply current from the Vc power supply line 210 from passing through the supply switch transistor 71 during the write operation of the bitcell 1164.

The write operation controller logic 290 (FIG. 2) of the control circuit 67 is configured to selectively direct a spin polarized write current through the dual cells 1168a, 1168b to write a particular bit state into the bitcell 1164 by providing appropriate signals on the bit line BL signal line 230a and the complementary bit line /BL signal line 230b. Thus, to store a logical one in a bitcell 1164 of an STTRAM 66 by passing (block 284, FIG. 5b) spin polarized current I_write1 (FIG. 11c) in one direction (left to right in FIG. 11c) through the complementary resistance state ferromagnetic devices 1170a, 1170b of the bitcell 1164, the bit line BL signal line 230a may be raised by the write operation controller logic 290 (FIG. 2) to a higher potential than that of complementary bit line /BL signal line 230b. Conversely, to store a logical zero in a bitcell 1164 of an STTRAM 66 by passing (block 284, FIG. 5b) spin polarized current I_write2 (FIG. 11d) in the other direction (right to left in FIG. 11d) through the complementary resistance state ferromagnetic devices 1170b, 1170a of the bitcell 1164, the complementary bit line /BL signal line 230b may be raised by the write operation controller logic 290 (FIG. 2) to a higher potential than that of the bit line BL signal line 230a.

It is seen from the above that a supply-switched dual cell memory bitcell 1164 of FIGS. 11a-11d may be both read from and written to without the use of source or select SL line signal lines utilized by various previous existing and proposed bitcells. In another aspect of a memory employing supply-switched dual cell memory bitcells 1164 in accordance with the present description, the supply line 210 (FIGS. 11a-11d) may be provided in the form of an orthogonal mesh or grid in a manner similar to that depicted in FIG. 10 for the grid 210 (FIG. 10) of a set of columnar power supply lines 210a interconnected at nodes 1020 with a set of row power supply lines 210b in connection with the supply-switched dual cell memory bitcells 64. In the embodiments of FIGS. 3a-3d, 10 and 11a-11d, a Vc power supply line such as a constant voltage or constant current line 210 is coupled by the supply switch 71 to the dual cells of the bitcell for read operations. However, it is appreciated that the supply line 210 may be a ground (GND) supply line, depending upon the particular application.

Figure 12:
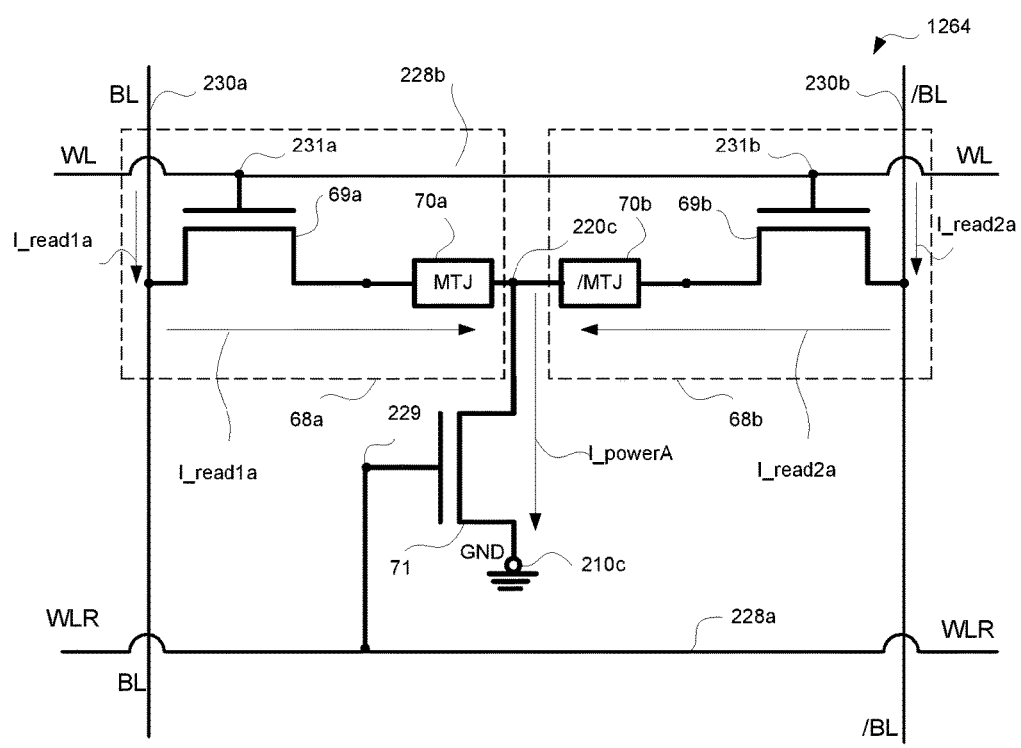
FIG. 12 depicts yet another embodiment of a supply-switched dual cell memory bitcell in accordance with the present description.

For example, FIG. 12 shows an embodiment in which in one read operation, a supply line such as GND supply line 210c (FIG. 12) is coupled (block 214, FIG. 5a) to a common node 220c (FIG. 12) of the bitcell 1264 by activation of the supply switch transistor 71 which is configured to couple the common node 220c to the supply when activated. In this embodiment, the supply switch transistor 71 is activated by read operation controller logic 212 (FIG. 2) of the memory control circuit 67 which is configured to activate the supply switch transistor 71 by driving a word line read (WLR) signal line 228a (FIG. 12) coupled to an input 229 of the supply switch transistor 71, to a true state, which turns the supply switch transistor 71 to an ON state, permitting a constant power current I_powerA to flow from the common node 220c, through the supply switch transistor 71, to the ground (GND) supply line 210c.

Also, first and second complementary read currents, I_read1a, I_read2a, (I_read1a+I_read2a=I_powerA), are driven (block 232, FIG. 5a) towards the common node 220c, through first and second complementary resistance state storage cells, 68a, 68b, respectively, from a pair of first and second complementary bit line BL, /BL signal lines 230a, 230b, respectively, of the bitcell 1264. In one embodiment, activation of storage cell switch transistor 69a of the first resistance state storage cell 68a permits the read current I_read1a to pass from the bit line BL signal line 230a, through the series-connected storage cell switch transistor 69a and MTJ 70a of the resistance state storage cell 68a, of the bitcell 1264.

In this embodiment, the storage cell switch transistor 69a is activated by read operation controller logic 212 (FIG. 2) of the memory control circuit 67, which is configured to drive a word line WL signal line 228b coupled to an input 231a of the storage cell switch transistor 69a, to a true state, which turns the storage cell switch transistor 69a to an ON state, permitting read current I_read1a to flow from the bit line BL signal line 230a, through the storage cell switch transistor 69a and the resistance state ferromagnetic device (MTJ) 70a to the common node 220c. The read current I_read1a on the bit line BL signal line 230a provides a bit state signal on the bit line BL signal line 230a.

Similarly, activation of storage cell switch transistor 69b of the first resistance state storage cell permits the complementary read current I_read2a to pass from the complementary bit line /BL signal line 230b, through the series-connected storage cell switch transistor 69b and MTJ 70b of the complementary resistance state storage cell 68b, to the common node 220c of the bitcell 1264.

In this embodiment, the storage cell switch transistor 69*b* is activated by read operation controller logic 212 (FIG. 2) of the memory control circuit 67, which is configured to drive the word line WL signal line 228*b* coupled to an input 231*b* of the storage cell switch transistor 69*b*, to a true state, which turns the storage cell switch transistor 69*b* to an ON state, permitting read current I_read2a to flow from the bit line /BL signal line 230*b*, through the storage cell switch transistor 69*b* and resistance state ferromagnetic device (MTJ) 70*b*, and to the common node 220*c*. The read current I_read2a on the complementary bit line /BL signal line 230*b* provides a complementary state signal on the complementary bit line /BL signal line 230*b*.

The complementary bit state signals represented by the complementary read currents I_read1a, I_read2a, on the complementary bit line BL, /BL signal lines, 230*a*, 230*b*, respectively are sensed, that is read (block 240, FIG. 5*a*) by a suitable sense amplifier. In another aspect of a memory employing supply-switched dual cell memory bitcells 1264 in accordance with the present description, the ground supply line 210*c* (FIG. 12) may be provided in the form of an orthogonal mesh or grid in a manner similar to that depicted in FIG. 10 for the grid 210 (FIG. 10). Thus, a grid 210*c* of ground supply lines may include a set of columnar ground supply lines interconnected at nodes with a set of row ground supply lines in a manner described above in connection with the power supply-switched dual cell memory bitcells 64.

EXAMPLES

The following examples pertain to further embodiments.

Example 1 is apparatus, comprising: a plurality of signal lines including a pair of complementary bit line signal lines, a first word line signal line and a second word line signal line, a supply line, and a bitcell configured to store a bit state, said bitcell including a common node and first and second complementary resistance state storage cells, each resistance state storage cell having an input coupled to the common node and an output coupled to a complementary bit line signal line, each complementary resistance state storage cell having a storage cell switch transistor having an input coupled to the first word line signal line, and a resistance state ferromagnetic device coupled in series with the storage cell switch transistor of the complementary resistance state storage cell and having a resistance state complementary to a resistance state of the resistance state ferromagnetic device of the complementary resistance state storage cell, and a supply switch transistor having an input coupled to the second word line signal line and configured to couple the common node to the supply line when activated.

In Example 2, the subject matter of Examples 1-9 (excluding the present Example) can optionally include a Spin Transfer Torque Random Access Memory (STTRAM) which includes a plurality of said bitcells arranged in a rectangular array, wherein a resistance state ferromagnetic device of each resistance state storage cell includes a magnetic-tunneling junction (MTJ).

In Example 3, the subject matter of Examples 1-9 (excluding the present Example) can optionally include a memory controller configured to control read and write operations directed to the bitcell, said memory controller having read operation controller logic configured to read the bit state of the bitcell, said read operation controller logic being configured to activate the storage cell switch transistors of the complementary resistance state storage cells and the supply switch transistor of the bitcell to cause the bitcell to provide complementary bit state signals on the complementary bit line signal lines wherein the bit state of the bitcell is read.

In Example 4, the subject matter of Examples 1-9 (excluding the present Example) can optionally include wherein the memory controller further has write operation controller logic configured to write a bit state into the bitcell, said write operation controller logic being configured to activate the storage cell switch transistors of the complementary resistance state storage cells and maintain the supply switch transistor of the bitcell as inactive to decouple the common node from the supply line, and to selectively direct one of a first write current in a first direction through the resistance state storage cells to write a first bit state into the bitcell, and a second write current in a second direction opposite the first direction through the resistance state storage cells to write a second bit state opposite the first bit state into the bitcell.

In Example 5, the subject matter of Examples 1-9 (excluding the present Example) can optionally include wherein a first resistance state ferromagnetic device of the first resistance state storage cell is a first magnetic-tunneling junction (MTJ) and a second resistance state ferromagnetic device of the second resistance state storage cell is a second magnetic-tunneling junction (MTJ).

In Example 6, the subject matter of Examples 1-9 (excluding the present Example) can optionally include wherein a first storage cell switch transistor and a first MTJ of the first resistance state storage cell are series connected between the common node and a bit line signal line, a second storage cell switch transistor and a first second of the second resistance state storage cell are series connected between the common node and a bit line signal line.

In Example 7, the subject matter of Examples 1-9 (excluding the present Example) can optionally include a supply which is one of a power supply and a ground supply coupled to the supply line, a memory which includes a plurality of said bitcells arranged in a rectangular array, and an orthogonal grid of supply lines including a first set of parallel spaced supply lines coupled to the supply and arranged in a first direction with respect to the rectangular array of bitcells, and a second set of parallel spaced supply lines coupled to the supply and arranged in a second direction orthogonal to the first direction of the first set of parallel spaced supply lines.

In Example 8, the subject matter of Examples 1-9 (excluding the present Example) can optionally include wherein the pair of complementary bit line signal lines are arranged in a first set of parallel spaced bit line signal lines in a first direction, and the first and second word line signal lines are arranged in a second set of parallel spaced word line signal lines in a second direction orthogonal to the first direction of the first set of bit line signal lines.

In Example 9, the subject matter of Examples 1-9 (excluding the present Example) can optionally include a computing system comprising: a memory, a processor configured to cause a data write into or data read from the memory, and any of: a display communicatively coupled to the processor, a network interface communicatively coupled to the processor, or a battery coupled to provide power to the system, wherein the memory includes a magnetoresistive random access memory (MRAM), comprising: said pair of complementary bit line signal lines, said first word line signal line and said second word line signal line, said supply line, and an array of said bitcells, each of which is an MRAM bitcell.

Example 10 is a method, comprising: reading a bit state in a bitcell including: coupling a supply line to a common node of the bitcell to drive first and second complementary currents through first and second complementary resistance state storage cells, respectively, of the bitcell, to a pair of first and second complementary bit line signal lines, respectively, of the bitcell, each resistance state storage cell having one of a first and second resistance state ferromagnetic device coupled between the common node and a bit line signal line of the first and second bit line signal lines, each resistance state ferromagnetic device having a resistance state complementary to a resistance state of the resistance state ferromagnetic device of the complementary resistance state storage cell, wherein the first and second complementary currents are driven through the first and second resistance state ferromagnetic devices of the first and second complementary resistance state storage cells, respectively, and sensing complementary bit state signals on the pair of first and second complementary bit line signal lines.

In Example 11 the subject matter of Examples 10-17 (excluding the present Example) can optionally include wherein each of the first and second resistance state ferromagnetic devices of the first and second complementary resistance state storage cells, respectively, includes a magnetic-tunneling junction (MTJ) and wherein a plurality of said bitcells are arranged in a rectangular array of a Spin Transfer Torque Random Access Memory (STTRAM).

In Example 12 the subject matter of Examples 10-17 (excluding the present Example) can optionally include using read operation controller logic of a memory controller to read the bit state of the bitcell, wherein the bit state reading further includes activating first and second storage cell switch transistors of the first and second complementary resistance state storage cells, respectively, to permit the first and second complementary currents to pass through the first and second complementary resistance state storage cells, respectively, and activating a supply switch transistor of the bitcell to couple the supply line to the common node of the bitcell to drive the first and second complementary currents through the first and second complementary resistance state storage cells, respectively, to cause the bitcell to provide complementary bit state signals on the complementary bit line signal lines wherein the bit state of the bitcell is read.

In Example 13 the subject matter of Examples 10-17 (excluding the present Example) can optionally include using write operation controller logic of the memory controller to write a bit state into the bitcell, wherein the bit state writing includes: activating the first and second storage cell switch transistors of the complementary resistance state storage cells, maintaining the supply switch transistor of the bitcell as inactive to decouple the supply line from the common node of the complementary resistance state storage cells of the bitcell, and selectively directing one of a first write current in a first direction through the resistance state storage cells to write a first bit state into the bitcell, and a second write current in a second direction opposite the first direction through the resistance state storage cells to write a second bit state opposite the first bit state into the bitcell.

In Example 14 the subject matter of Examples 10-17 (excluding the present Example) can optionally include wherein the first resistance state ferromagnetic device of the first resistance state storage cell is a first magnetic-tunneling junction (MTJ) and the second resistance state ferromagnetic device of the second resistance state storage cell is a second magnetic-tunneling junction (MTJ).

In Example 15 the subject matter of Examples 10-17 (excluding the present Example) can optionally include wherein driving first and second complementary currents through first and second complementary resistance state storage cells, respectively includes driving the first complementary current through the first MTJ and the first storage cell switch transistor which are series connected between the common node and the first bit line signal line, and driving the second complementary current through the second MTJ and the second storage cell switch transistor which are series connected between the common node and the second bit line signal line.

In Example 16 the subject matter of Examples 10-17 (excluding the present Example) can optionally include wherein the bitcell is a bitcell of a plurality of bitcells arranged in a rectangular array, and wherein the coupling a supply line to a common node of the bitcell further comprises coupling a supply line of an orthogonal grid of supply lines including a first set of parallel spaced supply lines coupled to a supply and arranged in a first direction with respect to the rectangular array of bitcells, and a second set of parallel spaced supply lines coupled to the supply and arranged in a second direction orthogonal to the first direction of the first set of parallel spaced supply lines wherein the supply lines are one of power supply lines and ground supply lines.

In Example 17 the subject matter of Examples 10-17 (excluding the present Example) can optionally include wherein the sensing complementary bit state signals on the pair of first and second complementary bit line signal lines includes sensing the complementary bit state signals on the pair of first and second complementary bit line signal lines arranged in a first set of parallel spaced bit line signal lines in a first direction, and wherein the activating first and second storage cell switch transistors of the first and second complementary resistance state storage cells includes driving signals on first and second word line signal lines arranged in a second set of parallel spaced word line signal lines in a second direction orthogonal to the first direction of the first set of bit line signal lines.

Example 18 is a memory apparatus comprising means to perform a method as claimed in any preceding Example.

Example 19 is a computing system, comprising: a memory, and a processor configured to cause a data write into or data read from the memory, wherein the memory includes a magnetoresistive random access memory (MRAM), comprising: a pair of complementary bit line signal lines, a first word line signal line and a second word line signal line, an array of MRAM bitcells, each bitcell configured to store a bit state, each bitcell including: a common node, first and second complementary resistance state storage cells, each resistance state storage cell having an input coupled to the common node, an output coupled to a complementary bit line signal line, a storage cell switch transistor having an input coupled to the first word line signal line, and a resistance state ferromagnetic device coupled in series with the storage cell switch transistor of the resistance state storage cell and having a resistance state complementary to a resistance state of the resistance state ferromagnetic device of the complementary resistance state storage cell, wherein each resistance state ferromagnetic device has a polarization which in a first state is one of parallel and anti-parallel polarization and in a second state is the other of parallel and anti-parallel polarization, a supply line which is one of a power supply line and a ground supply line, and a supply switch transistor having an input coupled to the second word line signal line and configured to couple the common node to the supply line when activated.

In Example 20 the subject matter of Examples 19-27 (excluding the present Example) can optionally include wherein the magnetoresistive random access memory is a Spin Transfer Torque Random Access Memory (STTRAM) which includes a plurality of said bitcells arranged in a rectangular array, wherein a resistance state ferromagnetic device of each resistance state storage cell includes a magnetic-tunneling junction (MTJ).

In Example 21 the subject matter of Examples 19-27 (excluding the present Example) can optionally include a memory controller configured to control read and write operations directed to the bitcell, said memory controller having read operation controller logic configured to read the bit state of the bitcell, said read operation controller logic being configured to activate the storage cell switch transistors of the complementary resistance state storage cells and the supply switch transistor of the bitcell to cause the bitcell to provide complementary bit state signals on the complementary bit line signal lines wherein the bit state of the bitcell is read.

In Example 22 the subject matter of Examples 19-27 (excluding the present Example) can optionally include wherein the memory controller further has write operation controller logic configured to write a bit state into the bitcell, said write operation controller logic being configured to activate the storage cell switch transistors of the complementary resistance state storage cells and maintain the supply switch transistor of the bitcell as inactive, and to selectively direct one of a first write current in a first direction through the resistance state storage cells to write a first bit state into the bitcell, and a second write current in a second direction opposite the first direction through the resistance state storage cells to write a second bit state opposite the first bit state into the bitcell.

In Example 23 the subject matter of Examples 19-27 (excluding the present Example) can optionally include wherein a first resistance state ferromagnetic device of the first resistance state storage cell is a first magnetic-tunneling junction (MTJ) and a second resistance state ferromagnetic device of the second resistance state storage cell is a second magnetic-tunneling junction (MTJ).

In Example 24 the subject matter of Examples 19-27 (excluding the present Example) can optionally include wherein a first storage cell switch transistor and a first MTJ of the first resistance state storage cell are series connected between the common node and a bit line signal line, a second storage cell switch transistor and a first second of the second resistance state storage cell are series connected between the common node and a bit line signal line.

In Example 25 the subject matter of Examples 19-27 (excluding the present Example) can optionally include wherein said memory includes a plurality of said bitcells arranged in a rectangular array, and an orthogonal grid of supply lines including a first set of parallel spaced supply lines coupled to the supply and arranged in a first direction with respect to the rectangular array of bitcells, and a second set of parallel spaced supply lines coupled to the supply and arranged in a second direction orthogonal to the first direction of the first set of parallel spaced supply lines wherein the supply lines are one of power supply lines and ground supply lines.

In Example 26 the subject matter of Examples 19-27 (excluding the present Example) can optionally include wherein the pair of complementary bit line signal lines are arranged in a first set of parallel spaced bit line signal lines in a first direction, and the first and second word line signal lines are arranged in a second set of parallel spaced word line signal lines in a second direction orthogonal to the first direction of the first set of bit line signal lines.

In Example 27 the subject matter of Examples 19-27 (excluding the present Example) can optionally include any of: a display communicatively coupled to the processor, a network interface communicatively coupled to the processor, or a battery coupled to provide power to the system.

Example 28 is an apparatus, comprising: a plurality of signal lines including a pair of complementary bit line signal lines, a first word line signal line and a second word line signal line, a supply line, and a bitcell means for storing a bit state, said bitcell means including a common node and first and second complementary resistance state storage cells, each resistance state storage cell having an input coupled to the common node and an output coupled to a complementary bit line signal line, each complementary resistance state storage cell having a storage cell switch transistor having an input coupled to the first word line signal line, and a resistance state ferromagnetic device coupled in series with the storage cell switch transistor of the complementary resistance state storage cell and having a resistance state complementary to a resistance state of the resistance state ferromagnetic device of the complementary resistance state storage cell, and a supply switch transistor means having an input coupled to the second word line signal line, for coupling the common node to the supply line when activated.

In Example 29 the subject matter of Examples 28-36 (excluding the present Example) can optionally include a Spin Transfer Torque Random Access Memory (STTRAM) which includes a plurality of said bitcell means arranged in a rectangular array, wherein a resistance state ferromagnetic device of each resistance state storage cell includes a magnetic-tunneling junction (MTJ).

In Example 30 the subject matter of Examples 28-36 (excluding the present Example) can optionally include a memory controller means for controlling read and write operations directed to the bitcell means, said memory controller means having read operation controller logic means for reading the bit state of the bitcell means, said read operation controller logic means being configured to activate the storage cell switch transistors of the complementary resistance state storage cells and the supply switch transistor means of the bitcell means to cause the bitcell means to provide complementary bit state signals on the complementary bit line signal lines wherein the bit state of the bitcell means is read.

In Example 31 the subject matter of Examples 28-36 (excluding the present Example) can optionally include wherein the memory controller means further has write operation controller logic means for writing a bit state into the bitcell means, said write operation controller logic means being configured to activate the storage cell switch transistors of the complementary resistance state storage cells and maintain the supply switch transistor means of the bitcell means as inactive to decouple the common node from the supply line, and to selectively direct one of a first write current in a first direction through the resistance state storage cells to write a first bit state into the bitcell means, and a second write current in a second direction opposite the first direction through the resistance state storage cells to write a second bit state opposite the first bit state into the bitcell means.

In Example 32 the subject matter of Examples 28-36 (excluding the present Example) can optionally include wherein a first resistance state ferromagnetic device of the first resistance state storage cell is a first magnetic-tunneling junction (MTJ) and a second resistance state ferromagnetic device of the second resistance state storage cell is a second magnetic-tunneling junction (MTJ).

In Example 33 the subject matter of Examples 28-36 (excluding the present Example) can optionally include wherein a first storage cell switch transistor and a first MTJ of the first resistance state storage cell are series connected between the common node and a bit line signal line, a second storage cell switch transistor and a first second of the second resistance state storage cell are series connected between the common node and a bit line signal line.

In Example 34 the subject matter of Examples 28-36 (excluding the present Example) can optionally include a supply which is one of a power supply and a ground supply coupled to the supply line, a memory which includes a plurality of said bitcell means arranged in a rectangular array, and an orthogonal grid of supply lines including a first set of parallel spaced supply lines coupled to the supply and arranged in a first direction with respect to the rectangular array of bitcell means, and a second set of parallel spaced supply lines coupled to the supply and arranged in a second direction orthogonal to the first direction of the first set of parallel spaced supply lines.

In Example 35 the subject matter of Examples 28-36 (excluding the present Example) can optionally include wherein the pair of complementary bit line signal lines are arranged in a first set of parallel spaced bit line signal lines in a first direction, and the first and second word line signal lines are arranged in a second set of parallel spaced word line signal lines in a second direction orthogonal to the first direction of the first set of bit line signal lines.

In Example 36 the subject matter of Examples 28-36 (excluding the present Example) can optionally include a computing system for use with a display, said computing system comprising: a memory, a processor configured to write data in and read data from the memory, and a video controller configured to display information represented by data in the memory, wherein the memory includes a magnetoresistive random access memory (MRAM), comprising: said pair of complementary bit line signal lines, said first word line signal line and said second word line signal line, said supply line, and an array of said bitcell means, each of which is an MRAM bitcell.

The described operations may be implemented as a method, apparatus or computer program product using standard programming and/or engineering techniques to produce software, firmware, hardware, or any combination thereof. The described operations may be implemented as computer program code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmissions signals. Those skilled in the art will recognize that many modifications may be made to this configuration without departing from the scope of the present description, and that the article of manufacture may comprise suitable information bearing medium known in the art. Of course, those skilled in the art will recognize that many modifications may be made to this configuration without departing from the scope of the present description, and that the article of manufacture may comprise any tangible information bearing medium known in the art.

In certain applications, a device in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the device embodiments may be embodied in a computing device that does not include, for example, a video controller, such as a switch, router, etc., or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit to the precise form disclosed. Many modifications and variations are possible in light of the above teaching.

What is claimed is:

1. An apparatus, comprising:
a plurality of signal lines including a pair of complementary bit line signal lines, a first word line signal line and a second word line signal line;
a supply line; and
a bitcell configured to store a bit state, said bitcell including a common node and first and second complementary resistance state storage cells, each resistance state storage cell having an input coupled to the common node and an output coupled to a complementary bit line signal line, each complementary resistance state storage cell having a storage cell switch transistor having an input coupled to the first word line signal line, and a resistance state ferromagnetic device coupled in series with the storage cell switch transistor of the complementary resistance state storage cell and having a resistance state complementary to a resistance state of the resistance state ferromagnetic device of the complementary resistance state storage cell, and a supply switch transistor having an input coupled to the second word line signal line and configured to couple the common node to the supply line when activated.

2. The apparatus of claim 1 further comprising a Spin Transfer Torque Random Access Memory (STTRAM) which includes a plurality of said bitcells arranged in a rectangular array, wherein a resistance state ferromagnetic device of each resistance state storage cell includes a magnetic-tunneling junction (MTJ).

3. The apparatus of claim 1, further comprising:
a memory controller configured to control read and write operations directed to the bitcell, said memory controller having read operation controller logic configured to read the bit state of the bitcell, said read operation controller logic being configured to activate the storage cell switch transistors of the complementary resistance state storage cells and the supply switch transistor of the bitcell to cause the bitcell to provide complementary bit state signals on the complementary bit line signal lines wherein the bit state of the bitcell is read.

4. The apparatus of claim 3 wherein the memory controller further has write operation controller logic configured to write a bit state into the bitcell, said write operation controller logic being configured to activate the storage cell switch transistors of the complementary resistance state storage cells and maintain the supply switch transistor of the bitcell as inactive to decouple the common node from the supply line, and to selectively direct one of a first write current in a first direction through the resistance state storage cells to write a first bit state into the bitcell, and a second write current in a second direction opposite the first direction through the resistance state storage cells to write a second bit state opposite the first bit state into the bitcell.

5. The apparatus of claim 1 wherein a first resistance state ferromagnetic device of the first resistance state storage cell is a first magnetic-tunneling junction (MTJ) and a second resistance state ferromagnetic device of the second resistance state storage cell is a second magnetic-tunneling junction (MTJ).

6. The apparatus of claim 5 wherein a first storage cell switch transistor and a first MTJ of the first resistance state storage cell are series connected between the common node and a bit line signal line, a second storage cell switch transistor and a first second of the second resistance state storage cell are series connected between the common node and a bit line signal line.

7. The apparatus of claim 1 further comprising a supply which is one of a power supply and a ground supply coupled to the supply line, a memory which includes a plurality of said bitcells arranged in a rectangular array, and an orthogonal grid of supply lines including a first set of parallel spaced supply lines coupled to the supply and arranged in a first direction with respect to the rectangular array of bitcells, and a second set of parallel spaced supply lines coupled to the supply and arranged in a second direction orthogonal to the first direction of the first set of parallel spaced supply lines.

8. The apparatus of claim 1 wherein the pair of complementary bit line signal lines are arranged in a first set of parallel spaced bit line signal lines in a first direction, and the first and second word line signal lines are arranged in a second set of parallel spaced word line signal lines in a second direction orthogonal to the first direction of the first set of bit line signal lines.

9. A method, comprising:
reading a bit state in a bitcell including:
coupling a supply line to a common node of the bitcell to drive first and second complementary currents through first and second complementary resistance state storage cells, respectively, of the bitcell, to a pair of first and second complementary bit line signal lines, respectively, of the bitcell, each resistance state storage cell having one of a first and second resistance state ferromagnetic device coupled between the common node and a bit line signal line of the first and second bit line signal lines, each resistance state ferromagnetic device having a resistance state complementary to a resistance state of the resistance state ferromagnetic device of the complementary resistance state storage cell, wherein the first and second complementary currents are driven through the first and second resistance state ferromagnetic devices of the first and second complementary resistance state storage cells, respectively; and
sensing complementary bit state signals on the pair of first and second complementary bit line signal lines.

10. The method of claim 9 wherein each of the first and second resistance state ferromagnetic devices of the first and second complementary resistance state storage cells, respectively, includes a magnetic-tunneling junction (MTJ) and wherein a plurality of said bitcells are arranged in a rectangular array of a Spin Transfer Torque Random Access Memory (STTRAM).

11. The method of claim 9, further comprising:
using read operation controller logic of a memory controller to read the bit state of the bitcell, wherein the bit state reading further includes activating first and second storage cell switch transistors of the first and second complementary resistance state storage cells, respectively, to permit the first and second complementary currents to pass through the first and second complementary resistance state storage cells, respectively, and activating a supply switch transistor of the bitcell to couple the supply line to the common node of the bitcell to drive the first and second complementary currents through the first and second complementary resistance state storage cells, respectively, to cause the bitcell to provide complementary bit state signals on the complementary bit line signal lines wherein the bit state of the bitcell is read.

12. The method of claim 11 further comprising using write operation controller logic of the memory controller to write a bit state into the bitcell, wherein the bit state writing includes:
activating the first and second storage cell switch transistors of the complementary resistance state storage cells;
maintaining the supply switch transistor of the bitcell as inactive to decouple the supply line from the common node of the complementary resistance state storage cells of the bitcell; and
selectively directing one of a first write current in a first direction through the resistance state storage cells to write a first bit state into the bitcell, and a second write current in a second direction opposite the first direction through the resistance state storage cells to write a second bit state opposite the first bit state into the bitcell.

13. The method of claim 11 wherein the first resistance state ferromagnetic device of the first resistance state storage cell is a first magnetic-tunneling junction (MTJ) and the second resistance state ferromagnetic device of the second resistance state storage cell is a second magnetic-tunneling junction (MTJ).

14. The method of claim 13 wherein driving first and second complementary currents through first and second complementary resistance state storage cells, respectively includes driving the first complementary current through the first MTJ and the first storage cell switch transistor which are series connected between the common node and the first bit line signal line, and driving the second complementary current through the second MTJ and the second storage cell switch transistor which are series connected between the common node and the second bit line signal line.

15. The method of claim 9 wherein the bitcell is a bitcell of a plurality of bitcells arranged in a rectangular array, and wherein the coupling a supply line to a common node of the bitcell further comprises coupling a supply line of an orthogonal grid of supply lines including a first set of parallel spaced supply lines coupled to a supply and arranged in a first direction with respect to the rectangular array of bitcells, and a second set of parallel spaced supply lines coupled to the supply and arranged in a second direction orthogonal to the first direction of the first set of parallel spaced supply lines wherein the supply lines are one of power supply lines and ground supply lines.

16. The method of claim 11 wherein the sensing complementary bit state signals on the pair of first and second complementary bit line signal lines includes sensing the complementary bit state signals on the pair of first and second complementary bit line signal lines arranged in a first set of parallel spaced bit line signal lines in a first direction, and wherein the activating first and second storage cell switch transistors of the first and second complementary resistance state storage cells includes driving signals on first and second word line signal lines arranged in a second set of parallel spaced word line signal lines in a second direction orthogonal to the first direction of the first set of bit line signal lines.

17. A computing system, comprising:
a memory; and
a processor configured to cause a data write into or data read from the memory;
wherein the memory includes a magnetoresistive random access memory (MRAM), comprising:
a pair of complementary bit line signal lines;
a first word line signal line and a second word line signal line;
an array of MRAM bitcells, each bitcell configured to store a bit state, each bitcell including:
a common node;
first and second complementary resistance state storage cells, each resistance state storage cell having an input coupled to the common node, an output coupled to a complementary bit line signal line, a storage cell switch transistor having an input coupled to the first word line signal line, and a resistance state ferromagnetic device coupled in series with the storage cell switch transistor of the resistance state storage cell and having a resistance state complementary to a resistance state of the resistance state ferromagnetic device of the complementary resistance state storage cell, wherein each resistance state ferromagnetic device has a polarization which in a first state is one of parallel and anti-parallel polarization and in a second state is the other of parallel and anti-parallel polarization;
a supply line which is one of a power supply line and a ground supply line; and
a supply switch transistor having an input coupled to the second word line signal line and configured to couple the common node to the supply line when activated.

18. The system of claim 17 wherein the magnetoresistive random access memory is a Spin Transfer Torque Random Access Memory (STTRAM) which includes a plurality of said bitcells arranged in a rectangular array, wherein a resistance state ferromagnetic device of each resistance state storage cell includes a magnetic-tunneling junction (MTJ).

19. The system of claim 17, further comprising:
a memory controller configured to control read and write operations directed to the bitcell, said memory controller having read operation controller logic configured to read the bit state of the bitcell, said read operation controller logic being configured to activate the storage cell switch transistors of the complementary resistance state storage cells and the supply switch transistor of the bitcell to cause the bitcell to provide complementary bit state signals on the complementary bit line signal lines wherein the bit state of the bitcell is read.

20. The system of claim 19 wherein the memory controller further has write operation controller logic configured to write a bit state into the bitcell, said write operation controller logic being configured to activate the storage cell switch transistors of the complementary resistance state storage cells and maintain the supply switch transistor of the bitcell as inactive, and to selectively direct one of a first write current in a first direction through the resistance state storage cells to write a first bit state into the bitcell, and a second write current in a second direction opposite the first direction through the resistance state storage cells to write a second bit state opposite the first bit state into the bitcell.

21. The system of claim 17 wherein a first resistance state ferromagnetic device of the first resistance state storage cell is a first magnetic-tunneling junction (MTJ) and a second resistance state ferromagnetic device of the second resistance state storage cell is a second magnetic-tunneling junction (MTJ).

22. The system of claim 21 wherein a first storage cell switch transistor and a first MTJ of the first resistance state storage cell are series connected between the common node and a bit line signal line, a second storage cell switch transistor and a first second of the second resistance state storage cell are series connected between the common node and a bit line signal line.

23. The system of claim 17 wherein said memory includes a plurality of said bitcells arranged in a rectangular array, and an orthogonal grid of supply lines including a first set of parallel spaced supply lines coupled to the supply and arranged in a first direction with respect to the rectangular array of bitcells, and a second set of parallel spaced supply lines coupled to the supply and arranged in a second direction orthogonal to the first direction of the first set of parallel spaced supply lines wherein the supply lines are one of power supply lines and ground supply lines.

24. The system of claim 17 wherein the pair of complementary bit line signal lines are arranged in a first set of parallel spaced bit line signal lines in a first direction, and the first and second word line signal lines are arranged in a second set of parallel spaced word line signal lines in a second direction orthogonal to the first direction of the first set of bit line signal lines.

25. The system of claim 17, further comprising any of:
a display communicatively coupled to the processor;
a network interface communicatively coupled to the processor; or
a battery coupled to provide power to the system.

* * * * *